United States Patent
Briggs et al.

(10) Patent No.: US 11,257,717 B2
(45) Date of Patent: Feb. 22, 2022

(54) SELECTIVE RECESSING TO FORM A FULLY ALIGNED VIA

(71) Applicant: Tessera, Inc., San Jose, CA (US)

(72) Inventors: Benjamin D. Briggs, Waterford, NY (US); Jessica Dechene, Latham, NY (US); Elbert E. Huang, Carmel, NY (US); Joe Lee, Niskayuna, NY (US); Theodorus E. Standaert, Clifton Park, NY (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 17/093,351

(22) Filed: Nov. 9, 2020

(65) Prior Publication Data

US 2021/0082758 A1 Mar. 18, 2021

Related U.S. Application Data

(60) Continuation of application No. 16/014,025, filed on Jun. 21, 2018, now Pat. No. 10,832,952, which is a
(Continued)

(51) Int. Cl.
*H01L 21/768* (2006.01)
*H01L 23/522* (2006.01)
(Continued)

(52) U.S. Cl.
CPC .... *H01L 21/76897* (2013.01); *H01L 21/7681* (2013.01); *H01L 21/7684* (2013.01);
(Continued)

(58) Field of Classification Search
CPC ......... H01L 21/02244; H01L 21/02252; H01L 21/02258; H01L 21/3111; H01L 21/31144;
(Continued)

(56) References Cited

U.S. PATENT DOCUMENTS 8,062,971 B2 11/2011 Riess et al.
8,298,943 B1 10/2012 Arnold et al.
(Continued)

FOREIGN PATENT DOCUMENTS

WO WO2007024300 A2 3/2007

OTHER PUBLICATIONS

Aoi, et al., "A Novel Clustered Hard Mask Technology for Dual Damascene Multilevel Interconnects With Self-Aligned via Formation Using an Organic Low k Dielectric," Proc. VLSI Tech. Symposium, pp. 41-42 (1999).
(Continued)

*Primary Examiner* — Mouloucoulaye Inoussa
(74) *Attorney, Agent, or Firm* — Lee & Hayes, P.C.

(57) ABSTRACT

A method of forming a semiconductor device having a vertical metal line interconnect (via) fully aligned to a first direction of a first interconnect layer and a second direction of a second interconnect layer in a selective recess region by forming a plurality of metal lines in a first dielectric layer; and recessing in a recess region first portions of the plurality of metal lines such that top surfaces of the first portions of the plurality of metal lines are below a top surface of the first dielectric layer; wherein a non-recess region includes second portions of the plurality of metal lines that are outside the recess region.

27 Claims, 23 Drawing Sheets

Related U.S. Application Data division of application No. 15/229,470, filed on Aug. 5, 2016, now Pat. No. 10,276,436.

(51) Int. Cl.
*H01L 23/528* (2006.01)
*H01L 23/532* (2006.01)

(52) U.S. Cl.
CPC .. *H01L 21/76834* (2013.01); *H01L 21/76883* (2013.01); *H01L 23/5226* (2013.01); *H01L 23/5283* (2013.01); *H01L 23/5329* (2013.01); *H01L 23/53228* (2013.01); *H01L 21/7682* (2013.01); *H01L 2221/1021* (2013.01)

(58) Field of Classification Search
CPC .......... H01L 21/76897; H01L 21/7681; H01L 21/76802; H01L 21/76834; H01L 23/5226; H01L 23/53228; H01L 23/5329; H01L 23/5283; H01L 23/53295; H01L 23/481

See application file for complete search history.

(56) References Cited

U.S. PATENT DOCUMENTS

| | | |
|---|---|---|
| 8,614,144 B2 | 12/2013 | Kato |
| 8,992,792 B2 | 3/2015 | Chang et al. |
| 2008/0173547 A1 | 7/2008 | Ohba et al. |
| 2010/0314777 A1 | 12/2010 | Oda |
| 2011/0284969 A1 | 11/2011 | Wu |
| 2014/0284813 A1 | 9/2014 | Greco et al. |
| 2014/0342549 A1 | 11/2014 | Holmes et al. |
| 2014/0363969 A1 | 12/2014 | Chen et al. |
| 2016/0064321 A1 | 3/2016 | Huang et al. |
| 2016/0343721 A1 | 11/2016 | Briggs et al. |
| 2017/0125530 A1* | 5/2017 | Zhang ............... H01L 29/42372 |
| 2018/0040510 A1 | 2/2018 | Briggs et al. |

OTHER PUBLICATIONS

Anonymous, "A Structure and Method for bi-Directionally Self-Aligned Vias (bSAV)," IP.Com No. IPCOM000201787D, Nov. 23, 2010, 4 pages.

Anonymous, "Bi-Directionally Self-Aligned Vias," IPCOM000231097D, Sep. 26, 2013, 6 pages.

IBM "List of IBM Patents or Patent Applications Treated as Related (Appendix P)," filed Jun. 21, 2018, 2 pages.

Tomizawa, et al., "Robust Self-Aligned Via Process for 64nm Pitch Dual-Damascene Interconnects Using Pitch Split Double Exposure Patterning Scheme," Proc. IEEE IITC, pp. 109-111 (2011).

Benjamin D. Briggs, et al., "Selective Recessing to Form a Fully Aligned via," U.S. Appl. No. 16/014,020, filed Jun. 21, 2018.

* cited by examiner

SELECTIVE RECESSING TO FORM A FULLY ALIGNED VIA

DOMESTIC PRIORITY

This application is a continuation of and claims priority to U.S. patent application Ser. No. 16/014,025, filed Jun. 21, 2018, which is a divisional of U.S. patent application Ser. No. 15/229,470, filed Aug. 5, 2016, now U.S. Pat. No. 10,276,436, issued Apr. 30, 2019, which are incorporated herein by reference in their entirety.

BACKGROUND

The present invention relates in general to semiconductor device fabrication methods and resulting structures. More specifically, the present invention relates to fabrication methods and resulting structures for a semiconductor device having a vertical metal line interconnect (via) fully aligned to a first direction of a first interconnect layer and a second direction of a second interconnect layer (i.e., M layers) in a selective recess region.

In contemporary semiconductor device fabrication processes, a large number of semiconductor devices and conductive interconnect layers are fabricated in and on a single wafer. The conductive interconnect layers serve as a network of pathways that transport signals throughout an integrated circuit (IC), thereby connecting circuit components of the IC into a functioning whole and to the outside world. Interconnect layers are themselves interconnected by a network of holes (or vias) formed through the wafer. As IC feature sizes continue to decrease, the aspect ratio (i.e., the ratio of height/depth to width) of features such as vias generally increases. Fabricating intricate structures of conductive interconnect layers and vias within an increasingly smaller wafer footprint is one of the most process-intensive and cost-sensitive portions of semiconductor IC fabrication.

SUMMARY

According to an embodiment of the present invention, a method of fabricating a semiconductor device having a vertical metal line interconnect (via) fully aligned to a first direction of a first interconnect layer and a second direction of a second interconnect layer in a selective recess region is provided. The method can include forming a plurality of metal lines in a first dielectric layer; and recessing in a recess region first portions of the plurality of metal lines such that top surfaces of the first portions of the plurality of metal lines are below a top surface of the first dielectric layer; wherein a non-recess region includes second portions of the plurality of metal lines that are outside the recess region.

According to another embodiment, a structure having a via fully aligned to a first direction of a first interconnect layer and a second direction of a second interconnect layer is provided. The structure can include a plurality of metal lines formed in a first dielectric layer; first portions of the plurality of metal lines recessed in a recess region such that top surfaces of the first portions of the plurality of metal lines are below a top surface of the first dielectric layer; and a non-recess region including second portions of the plurality of metal lines that are outside the recess region.

According to another embodiment, a method of fabricating a semiconductor device having a via fully aligned to a first direction of a first interconnect layer and a second direction of a second interconnect layer in a selective recess region is provided. The method can include forming a plurality of metal lines in a first dielectric layer; recessing in a recess region a first portion of a first metal line such that a top surface of the first portion of the first metal line is below a top surface of the first dielectric layer, the first metal line adjacent to a first side of a second metal line; and recessing in a recess region a first portion of a third metal line such that a top surface of the first portion of the third metal line is below a top surface of the first dielectric layer, the third metal line adjacent to a second side of the second metal line, wherein the first side and the second side are opposite sides of the second metal line; wherein a non-recess region includes second portions of the first metal line and the second metal line that are outside the recess region.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
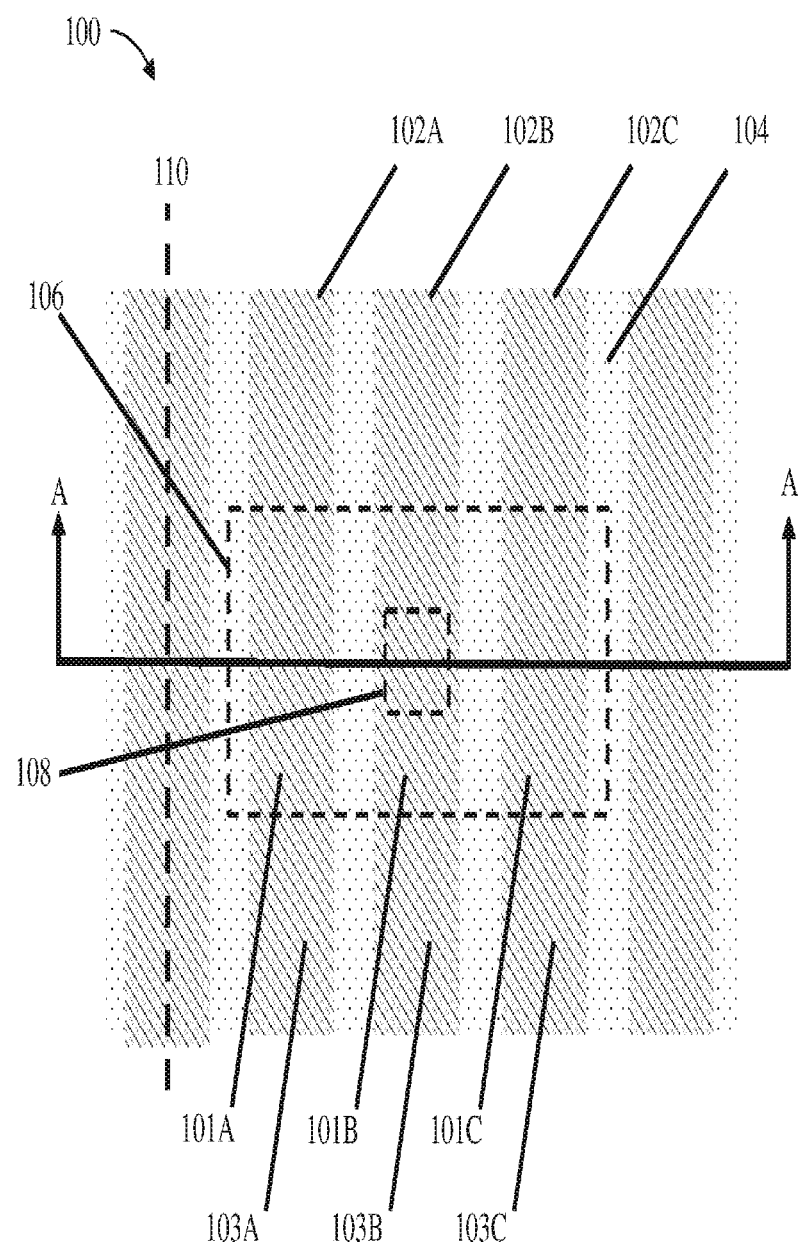
FIG. 1 depicts a top-down view of a structure having a plurality of metal lines in a first dielectric layer after an initial fabrication stage according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a via according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, the fabrication of very large scale integrated (VLSI) or ultra large scale integrated (ULSI) circuits requires an interconnect structure including metallic wiring that connects individual devices in a semiconductor chip to one another. Typically, the wiring interconnect network consists of two types of features that serve as electrical conductors, namely line features that traverse a distance across the chip, along with via features that connect lines in different levels. Typically, the conducting metal lines and vias are comprised of aluminum or copper and are electrically insulated by interlayer dielectrics (ILD). In the interconnect structure, laminations of via interlayer films are referred to herein as "V" layers, and interconnect interlayer films are referred to herein as "M" layers.

To improve performance, the semiconductor industry has repeatedly shrunk the transistor gate length and the chip size. As a consequence the interconnect structure that forms the metallic circuitry has also shrunk. As IC feature sizes continue to decrease, the aspect ratio, (i.e., the ratio of height/depth to width) of features such as vias generally increases. Fabricating intricate structures of conductive interconnect layers and vias within an increasingly smaller wafer footprint is one of the most process-intensive and cost-sensitive portions of semiconductor IC fabrication.

To improve the manufacturability of lithography fabrication operations, advanced masks that incorporate phase-shifting and optical proximity correction have been employed. In addition, as the size scale of these interconnects decrease, overlay error between features in the interconnect structure can lead to reliability issues. Overlay errors result from misalignment during the lithography process as the mask invariably becomes misaligned with the underlying structure. Although overlay errors can be mitigated by reworking the lithography operations, some level of overlay error is unavoidable.

Two failure modes for interconnects that can result from the overlay errors of lithographic patterns are electro-migration (EM) and time dependent dielectric breakdown (TDDB). EM failure results when a void forms in the conducting metal feature through metal diffusion leading to a short (or very high resistance) in the circuitry. The mechanism of EM is highly dependent upon the current density and the cross section of the metal features. If the wiring is constructed such that the intersection between a via and a line is too small, smaller voids formed by EM can lead to failure, which shortens the EM lifetime.

TDDB is a failure mode whereby the insulating materials (or layers) no longer serve as adequate electrical insulators resulting in unintended conductance between two adjacent metal features. This phenomenon is highly dependent upon the electrical field between the metal features because regions with higher electrical fields are more susceptible to TDDB failure. Consequently, it is a design goal to control the spacing between conducting metal features to maintain electrical fields to tolerable levels.

To combat via misalignment and the device failures associated therewith, it would be desirable if one could form a fully aligned via, which is a vertical metal line interconnect that is fully aligned to a first direction of a first interconnect layer and a second direction of a second interconnect layer. Some solutions to achieve a fully aligned via require either a global recess or a selective dielectric, i.e., a build-up approach, or a combination of both methods. These approaches are associated with a plurality of processing and lithography problems, including, for example, a negative impact on typical back end of line (BEOL) structures. Recess approaches to achieve a fully aligned via structure can create undesirably high incoming aspect ratios (ARs) having a narrow pitch, which can result in a non-ideal metal fill or ultra low-k dielectric (ULK) line flop over. Creating these high aspect ratios during reactive ion etching (RIE) presents its own challenges, such as hard mask selectivity. The required hard mask thickness increases as the AR increases. For ARs greater than about 3.0, the required hard mask thickness becomes relatively large and the selective removal of the hard mask becomes increasingly difficult.

Recess solutions can also have critical dimension dependence that negatively affects wide lines. Further, cap/ULK selectivity during the required dielectric etches is also challenging, due to the need to aggressively scale cap thickness due to RC time constant concerns. Moreover, while build-up approaches can achieve a fully aligned via, these approaches do so at the hard mask and are therefore subject to the overlay tolerance of lithography employed.

One or more embodiments of the present invention provide methods of fabricating a semiconductor device having a via fully aligned to both a first direction of a first interconnect layer and a second direction of a second interconnect layer in a selective recess region. Because the via alignment in the first direction is not done at the hard mask, the described method is free of any overlay dependency from upstream patterning associated therewith. The described method employs a selective recess process that mitigates via size variation through containment by selective materials. Methods for fabricating a fully aligned via in a selective recess region and the resulting structures therefrom in accordance with embodiments of the present invention are described in detail below by referring to the accompanying drawings in FIGS. 1-23.

FIG. 1 illustrates a top-down view of a structure 100 having a plurality of metal lines formed in a first dielectric layer 104 during an intermediate operation of a method of fabricating a semiconductor device that will have a fully aligned via 1000 (shown in FIG. 10) formed in a selective recess region 106 according to one or more embodiments. The selective recess region 106 overlaps a portion (e.g., 101A, 101B, 101C) of metal lines 102A, 102B, and 102C of the plurality of metal lines. The remaining metal lines of the plurality of metal lines lie outside the selective recess region 106. A via landing site 108 delineates a region within the selective recess region 106 where the via 1000 will be deposited during a damascene metallization operation, which will be described in greater detail later in this detailed description. The metal lines 102A, 102B, and 102C are parallel to each other in a first direction 110. For ease of illustration and description, only some of the plurality of metal lines are depicted (e.g., metal lines 102A, 102B, 102C, and two additional lines on either side thereof). However, it is understood that three or more metal lines can be utilized. Each of the metal lines 102A, 102B, or 102C includes a first portion 101A, 101B, or 101C that is within the selective recess region 106, as well as a second portion 103A, 103B, or 103C of the metals lines 102A, 102B, or 102C that is outside the selective recess region 106. The areas of the structure 100 that are outside the selective recess region 106 are, collectively, a non-recess region.

Figure 2:
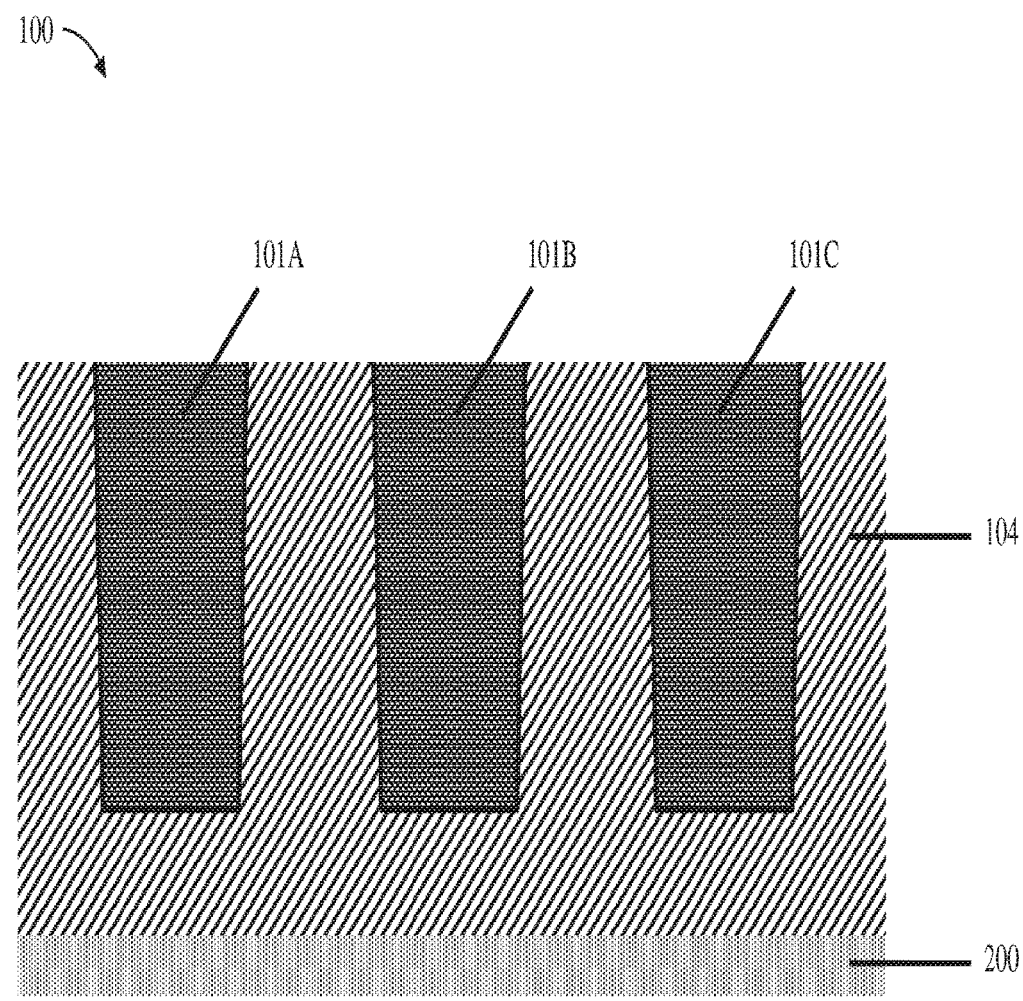
FIG. 2 depicts a cross-sectional view along line A-A of FIG. 1 showing a selective recess region according to one or more embodiments of the present invention.

FIG. 2 illustrates a cross-sectional view of the selective recess region 106 (shown in FIG. 1) of the structure 100 along the line A-A of FIG. 1 during an intermediate operation of a method of fabricating a semiconductor device according to one or more embodiments. The metal lines 102A, 102B, and 102C are shown deposited in the first dielectric layer 104 formed on a substrate 200. FIG. 2 illustrates the portions 101A, 101B, and 101C of the three metal lines 102A, 102B, and 102C that are within the selective recess region 106.

A variety of methods can be used to form the intermediate structure 100 illustrated in FIGS. 1 and 2. The metal lines 102A, 102B, and 102C can be fabricated using any technique, such as, for example, a single or dual damascene technique. In one or more embodiments, the metal lines 102A, 102B, and 102C are deposited in a dielectric layer by patterning the dielectric layer with open trenches where the conductor should be. The trenches in the dielectric are formed using, for example, a reactive ion etching (RIE) technique. RIE is a type of dry etching which uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field. Once the underlying oxide layer is patterned with open trenches a thick coating of copper that significantly overfills the trenches is deposited on the oxide layer, and chemical-mechanical planarization (CMP) is used to remove the portion of the copper (known as overburden) that extends above the top of the oxide layer. The remaining copper within the trenches of the oxide layer is not removed and becomes the patterned metal lines 102A, 102B, and 102C. In one or more embodiments, the metal lines 102A, 102B, and 102C can be any conductive material such as, for example, copper (Cu), aluminum (Al), or tungsten (W).

In one or more embodiments, the metal lines 102A, 102B, and 102C can be copper (Cu) and can include a barrier metal liner (not shown). The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese. It should be noted that the barrier metal liner is not required if the interlayer dielectrics insulating the metal lines 102A, 102B, and 102C are not susceptible to copper diffusion.

The first dielectric layer 104 is formed over substrate 200 and can include any dielectric material such as, for example, porous silicates, carbon doped oxides, silicon dioxides, silicon nitrides, silicon oxynitrides, or other dielectric materials. The first dielectric layer 104 can be formed using, for example, chemical vapor deposition (CVD), plasma enhanced chemical vapor deposition, atomic layer deposition, flowable CVD, spin-on dielectrics, or physical vapor deposition. The first dielectric layer 104 can have a thickness ranging from about 25 nm to about 200 nm. The substrate 200 can be of any suitable substrate material such as, for example, monocrystalline Si, SiGe, SiC, or semiconductor-on-insulator (SOI).

Figure 3:
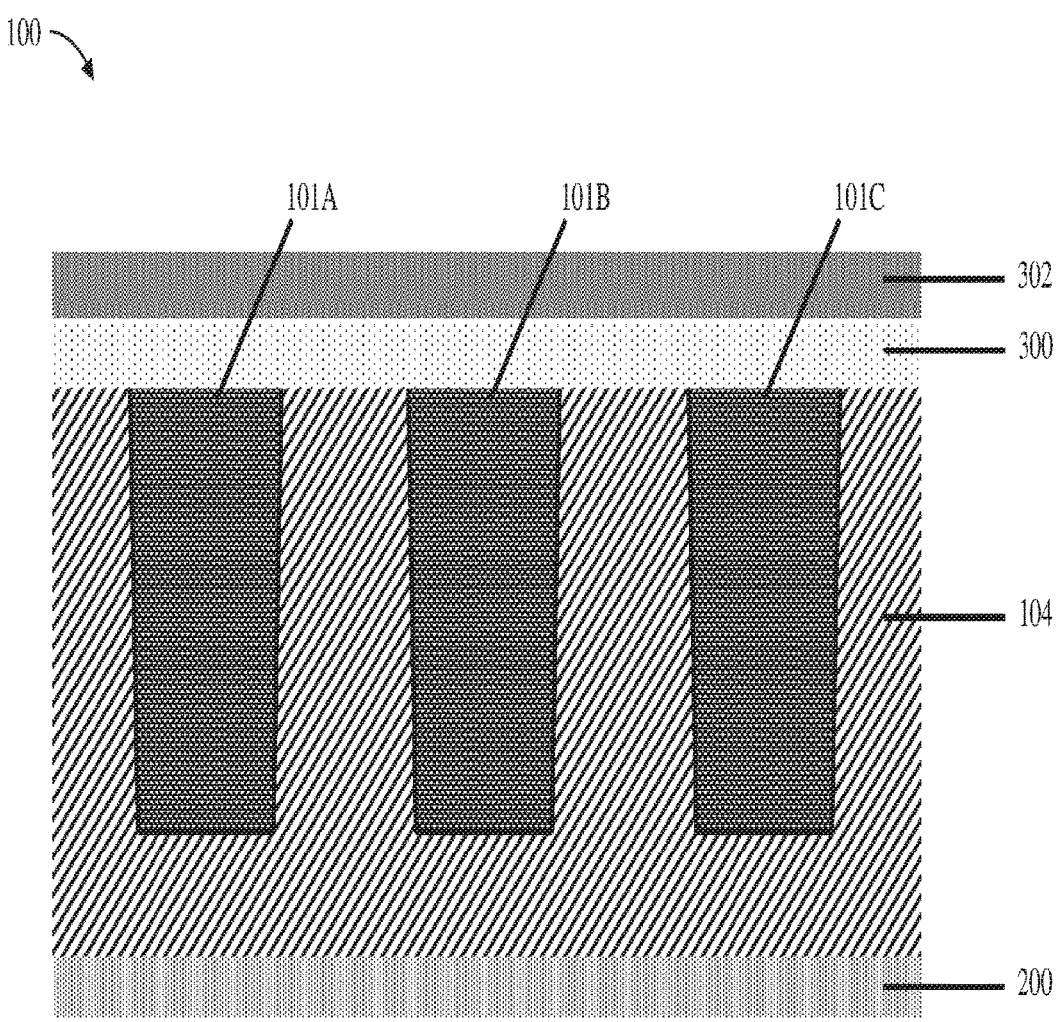
FIG. 3 depicts the cross-sectional view along line A-A after forming a sacrificial nitride layer and a low temperature oxide layer on the first dielectric layer according to one or more embodiments of the present invention.

FIG. 3 is a cross-sectional view after forming a sacrificial nitride layer 300 on the first dielectric layer 104 and forming a low temperature oxide layer 302 on the sacrificial nitride layer 300. The sacrificial nitride layer 300 can be any suitable material such as silicon nitride. The sacrificial nitride layer 300 is removable during a wet etching process. For example, silicon nitride can be removed using a buffered hydrofluoric acid (BHF) etch. The low temperature oxide layer 302 can be formed using a variety of known methods such as, for example, chemical vapor deposition, plasma enhanced chemical vapor deposition, atomic layer deposition, or physical vapor deposition. The sacrificial nitride layer 300 and low temperature oxide layer 302 serve as a hard mask over the first dielectric layer 104 and the metal lines 102A, 102B, and 102C.

Figure 4:
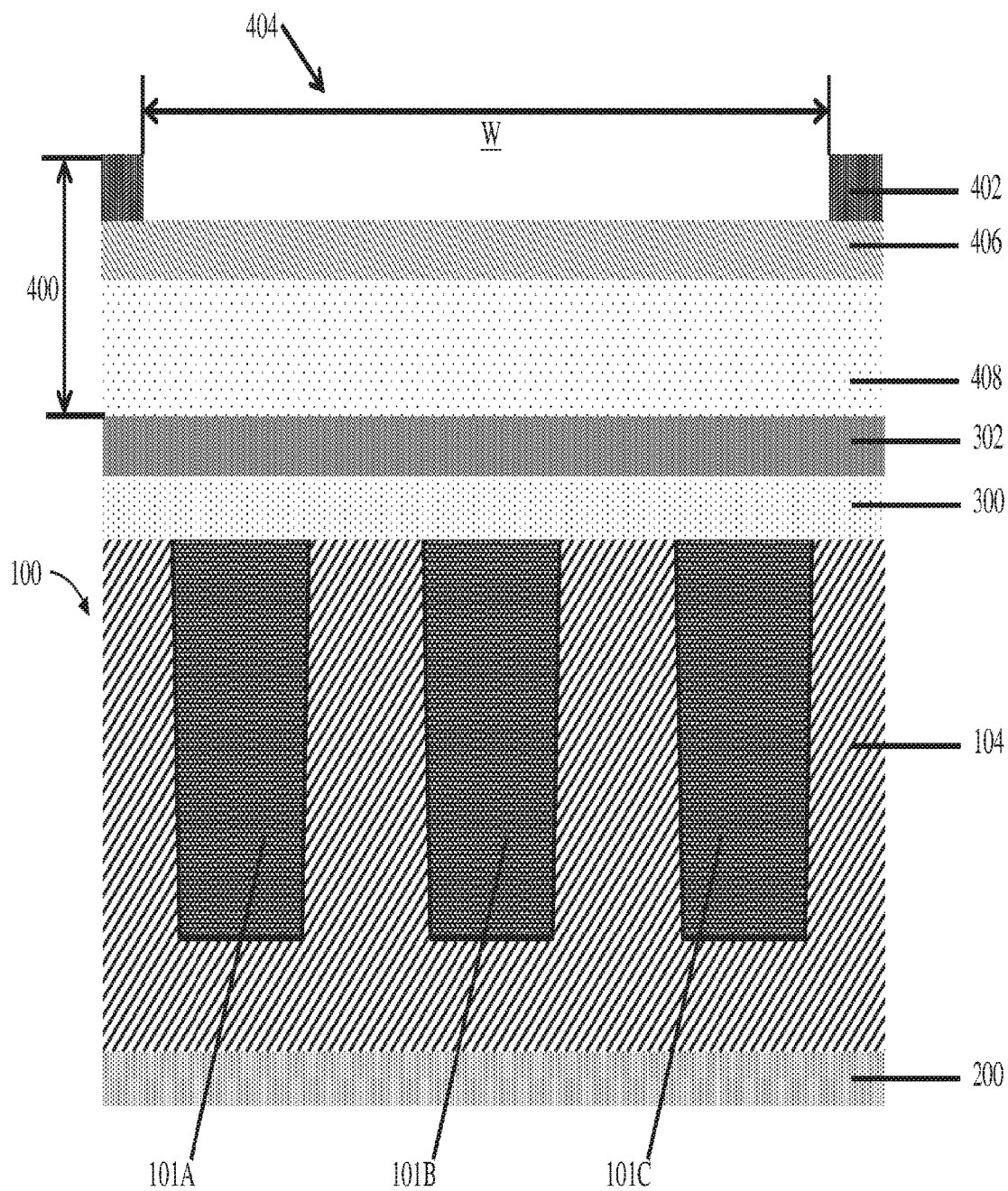
FIG. 4 depicts the cross-sectional view along line A-A after depositing a tri-layer mask pattern on the low temperature oxide layer according to one or more embodiments of the present invention.

FIG. 4 is a cross-sectional view after depositing a tri-layer mask pattern 400 on the low temperature oxide layer 302. The tri-layer mask pattern 400 includes a photoresist layer 402 selectively patterned with an opening 404 having a width W such that the photoresist layer 402 is on top of the second portions 103A, 103B, and 103C of the metals lines 102A, 102B, and 102C (i.e., those portions of the metal lines that are beyond or outside the selective recess region 106 as depicted in FIG. 1) and the remaining metal lines of the plurality of metal lines that lie outside the selective recess region 106, but not on top of the first portions 101A, 101B, and 101C of the metals lines 102A, 102B, and 102C (i.e., the portions of the metal lines that are under the opening 404 and inside the selective recess region 106). The photoresist layer 402 allows for the recessing selectivity of the first portions 101A, 101B, and 101C of the metal lines 102A, 102B, and 102C.

The tri-layer mask pattern includes an anti-reflective coating layer 406 and an organic underlayer 408, the anti-reflective coating layer 406 located in between the photoresist layer 402 and the organic underlayer 408. The organic underlayer 408 is located directly on top of the low temperature oxide layer 302. The tri-layer mask pattern can be made of any suitable materials and can be formed using any suitable methodology. In one embodiment, a silicon-based anti-reflective spin-on hard mask (Si—SOH) is deposited using a spin-on coating process. The Si—SOH is a tri-layer hard mask including a photoresist formed on an organic anti-reflective coating, such as a silicon-containing anti-reflective coating (SiARC), which is formed on an organic planarization underlayer (OPL). In another embodiment, the tri-layer mask can be formed using chemical vapor deposition (CVD) process. In still another embodiment, a tri-layer mask is not used. Instead, a bilayer resist (BLR) process (not illustrated) is used to pattern the opening 404.

Figure 5:
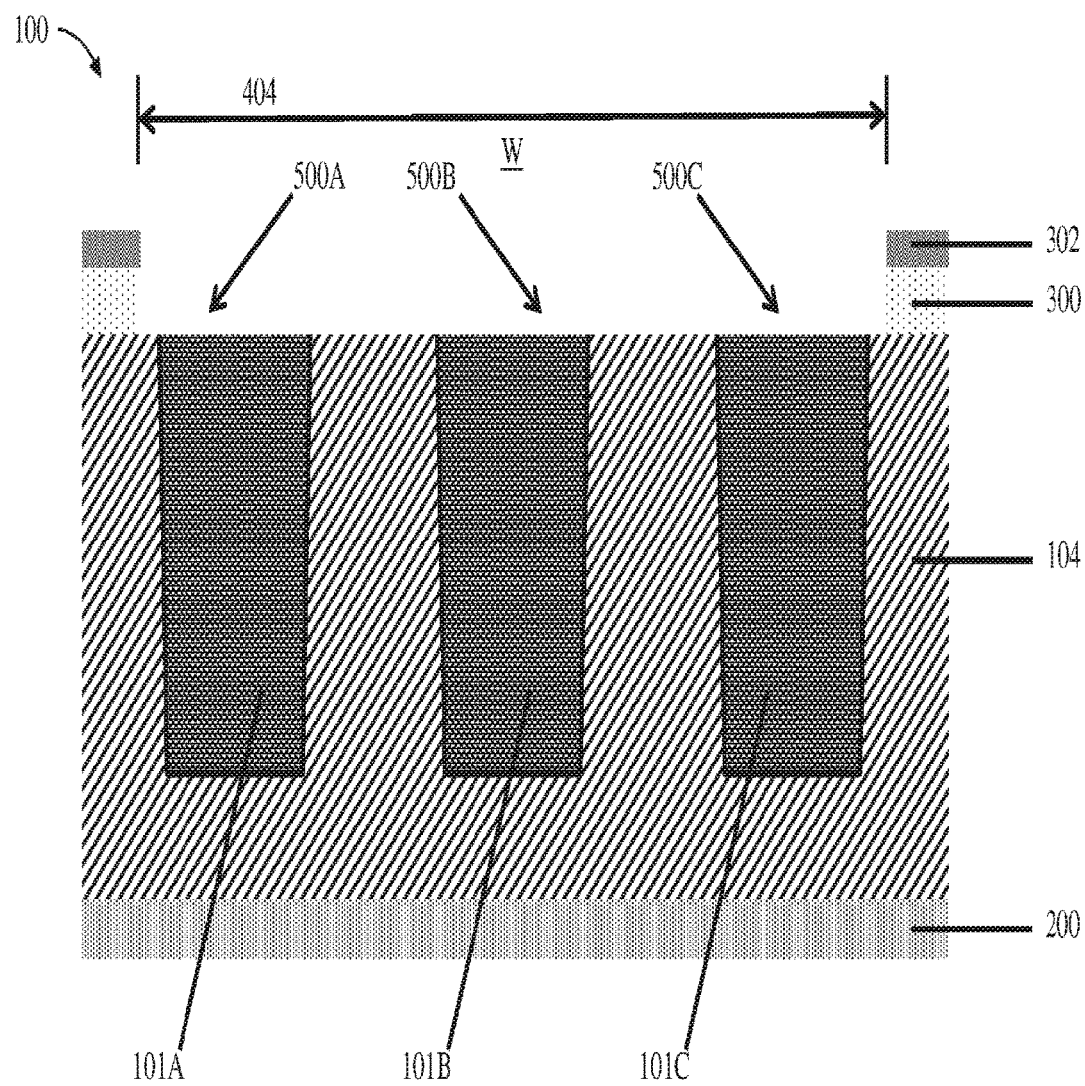
FIG. 5 depicts the cross-sectional view along line A-A after opening the tri-layer mask pattern and removing the sacrificial nitride layer and the low temperature oxide layer according to one or more embodiments of the present invention.

FIG. 5 is a cross-sectional view after opening the tri-layer mask pattern 400 and removing the sacrificial nitride layer 300 and the low temperature oxide layer 302 on top of the portions 101A, 101B, and 101C of the three metal lines 102A, 102B, and 102C to expose surfaces 500A, 500B, and 500C of the portions 101A, 101B, and 101C of the metal lines 102A, 102B, and 102C. In one embodiment, strong oxygen plasma is used to strip the lithographic stacks including the sacrificial nitride layer 300 and the low temperature oxide layer 302.

Figure 6:
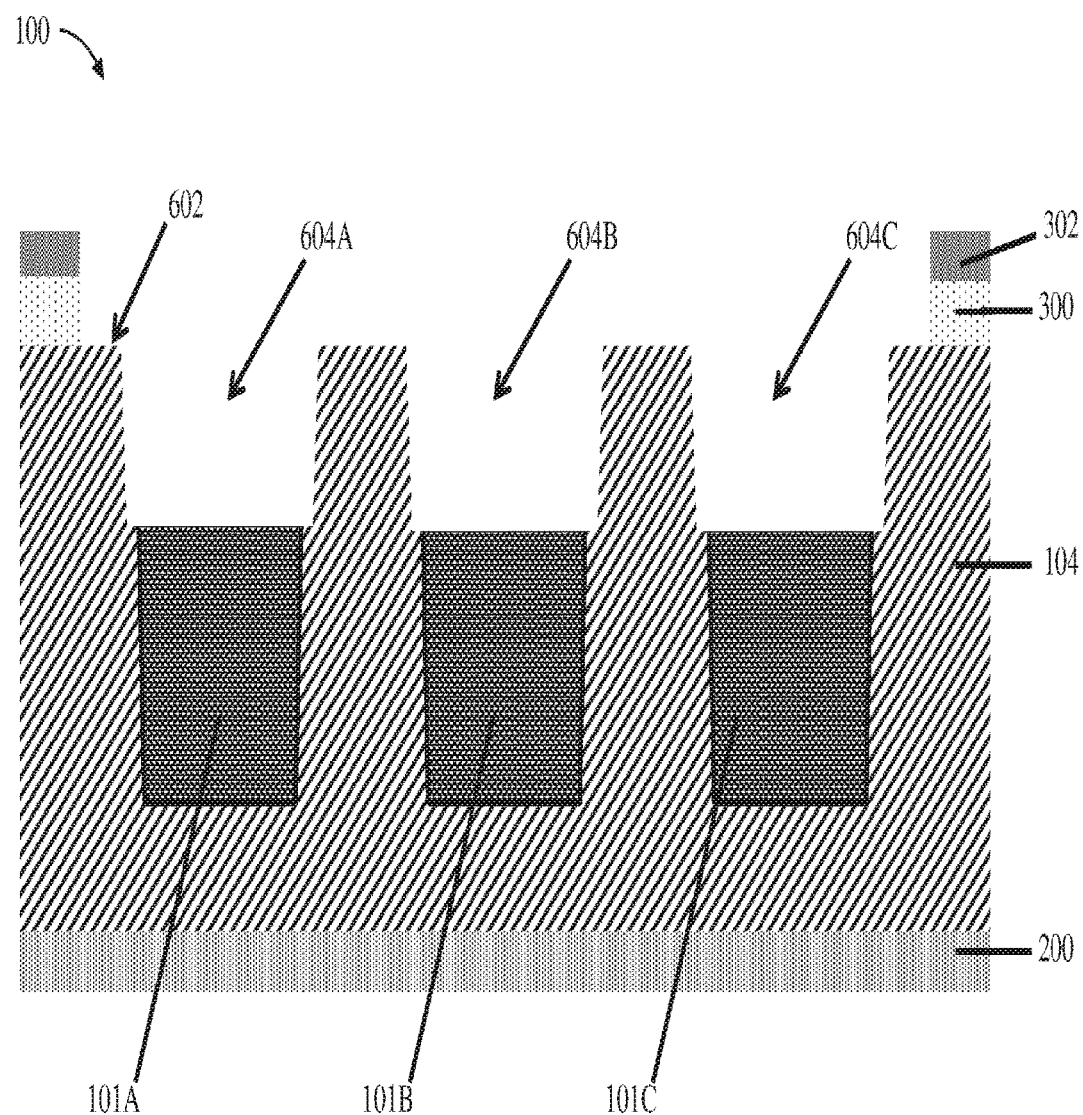
FIG. 6 depicts the cross-sectional view along line A-A after forming a plurality of recessed metal lines according to one or more embodiments of the present invention.

FIG. 6 is a cross-sectional view after forming recessed openings 604A, 604B, and 604C by recessing portions 101A, 101B, and 101C of the three metal lines 102A, 102B, and 102C within the selective recess region 106 below a top surface 602 of the first dielectric layer 104. The recessed openings 604A, 604B and 604C can be formed using any etching technique, such as, for example, reactive ion etching (RIE) and/or wet etching. In one embodiment, the recessing can be performed in a manner where the bulk of the metal lines can be removed in a separate operation from a metal barrier liner.

Figure 7:
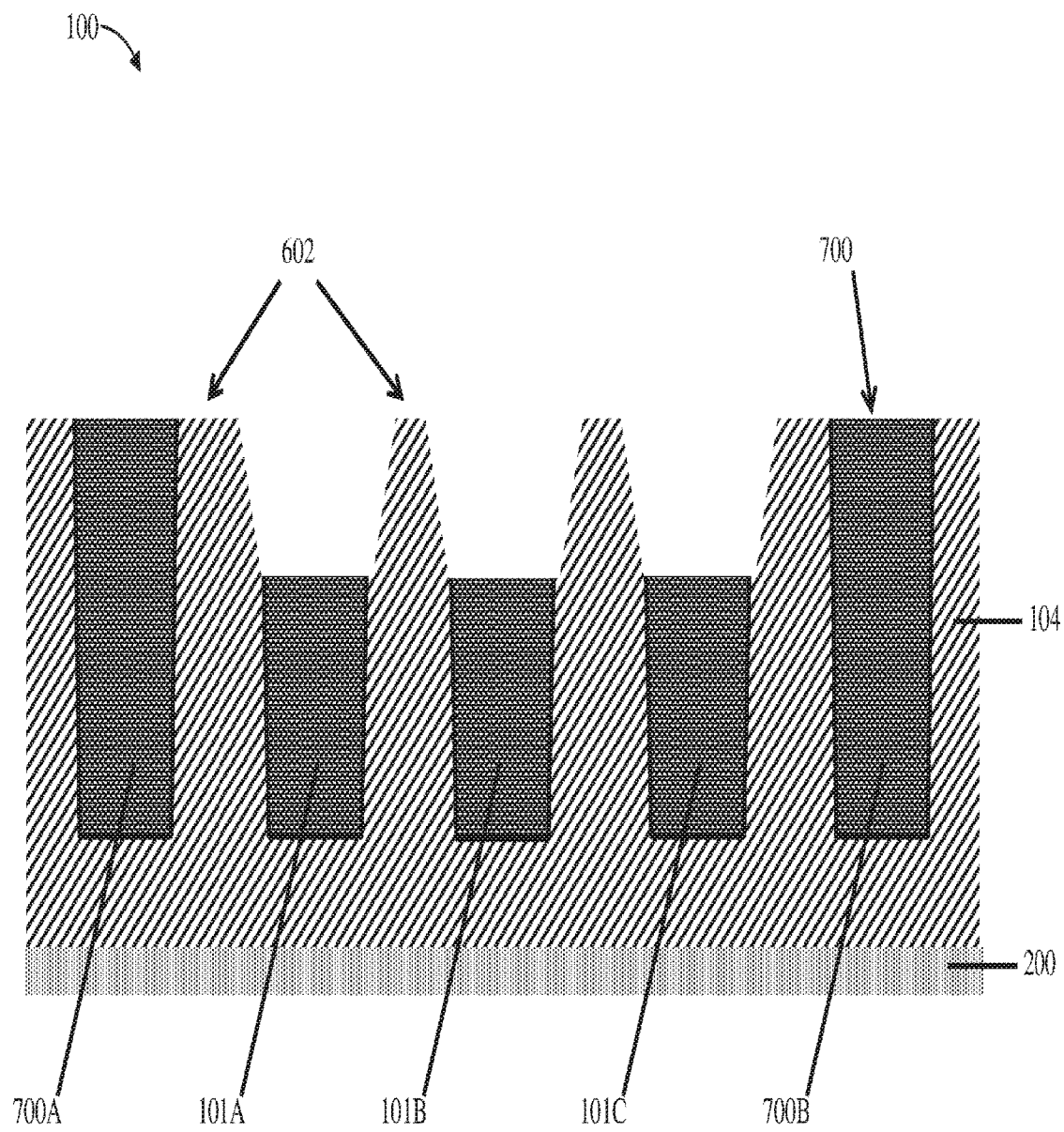
FIG. 7 depicts the cross-sectional view along line A-A after stripping the remaining low temperature oxide layer and sacrificial nitride layer hard mask according to one or more embodiments of the present invention.

FIG. 7 is an expanded cross-sectional view along the line A-A of FIG. 1 which includes metal lines 700A and 700B which are located outside of the selective recess region 106, as depicted in FIG. 1, after stripping the remaining low temperature oxide layer 302 and sacrificial nitride layer 300 hard mask over the plurality of metal lines to completely expose the top surface 602 of the first dielectric layer 104 and the top surface 700 of the metal lines which were not recessed.

Figure 8:
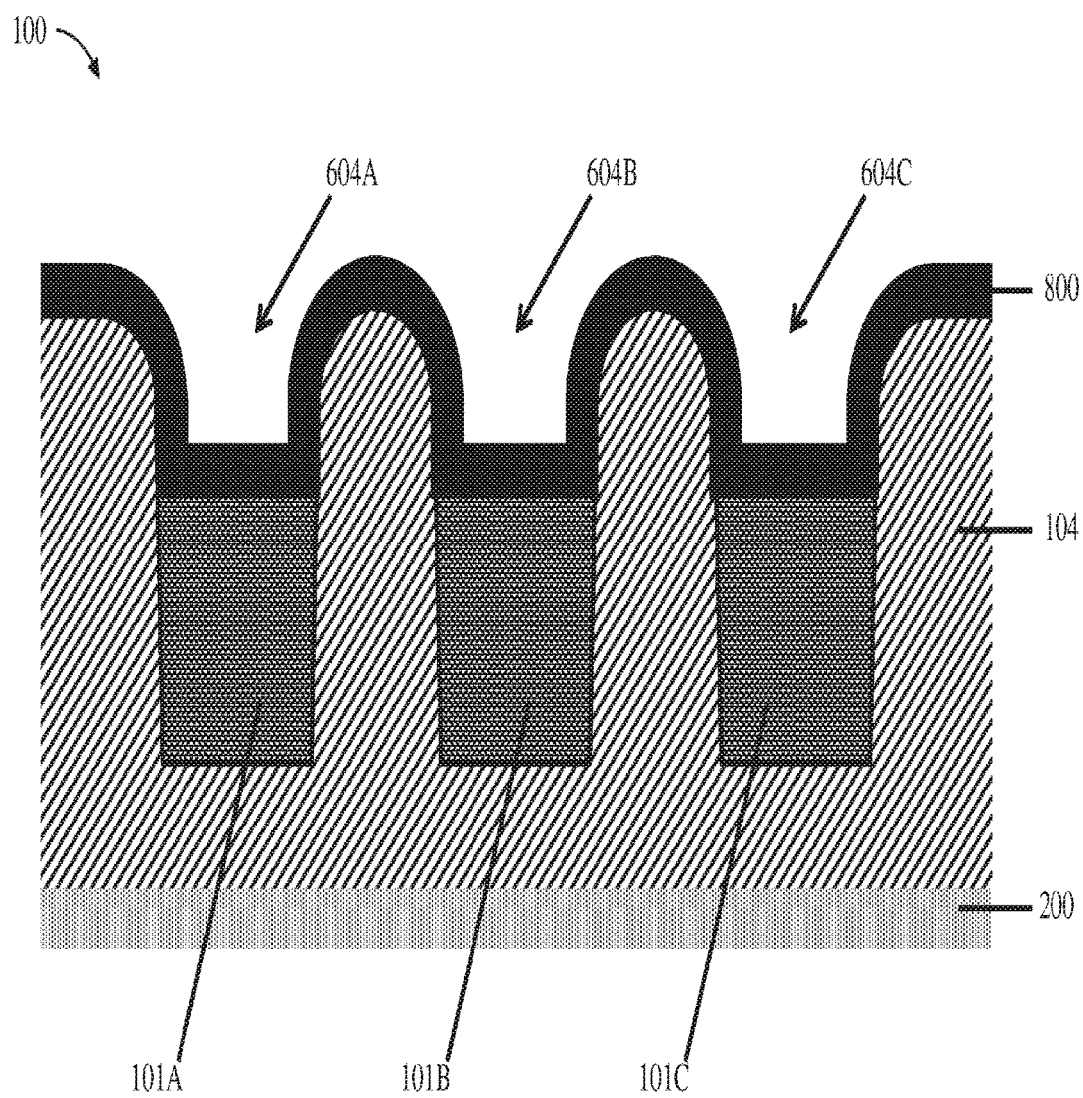
FIG. 8 depicts a cross-sectional view along line A-A after depositing a cap on the first dielectric layer and in the recessed openings according to one or more embodiments of the present invention.

FIG. 8 is a cross-sectional view after depositing a cap 800 on the first dielectric layer 104 and in the recessed openings 604A, 604B, and 604C. The cap can be semi-conformally formed using any suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. In some embodiments the cap is a silicon nitride, silicon carbonitride (SiNCH), or metal oxide.

In one embodiment, conventional plasma enhanced chemical vapor deposition (PECVD) in combination with cyclic deposition-plasma treatment is used for forming the semi-conformal cap. Low radio frequency (RF) plasma power is used to deposit ultra-thin nm) SiN film using silane and ammonia as precursors. Post deposition plasma treatment is performed to densify the film. Plasma nitridation is performed to improve the density of the SiN layers. This process can be repeated until the desired cap thickness is achieved.

Back End of Line (BEOL) capacitance is primarily governed by two components: the interlayer dielectric (ILD) and the dielectric barrier films. Lowering the dielectric constant of the barrier film can be preferred for capacitance reduction over the uses of lower k dielectrics, due to mechanical considerations, integration challenges and reliability requirements. Thinning the cap layer can be desirable because the caps often have higher dielectric constants than the neighboring dielectric, especially when using ULK dielectric. Thin caps are less selective than thick caps, however, and a tradeoff between selectivity and capacitance must be made. The first generation of dielectric cap that was integrated successfully with copper metallization was SiN In some applications SiNCH (k~5.3) can be preferable to SiN due to its lower dielectric constant.

Figure 9:
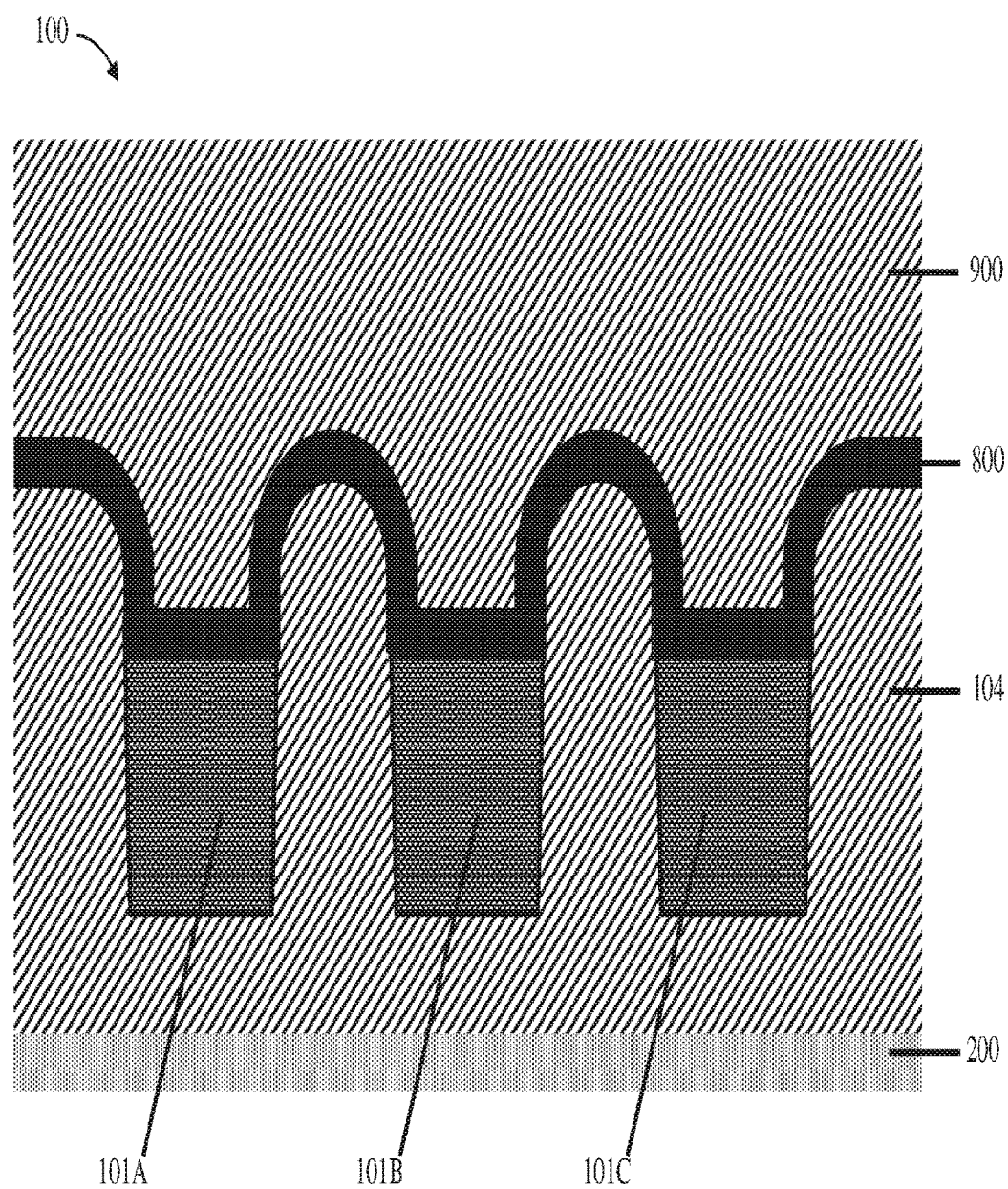
FIG. 9 depicts a cross-sectional view along line A-A after forming a second dielectric layer on the cap according to one or more embodiments of the present invention.

FIG. 9 is a cross-sectional view after forming a second dielectric layer 900 on the cap 800. In some embodiments, the first dielectric layer 104 and the second dielectric layer 900 are the same dielectric material. The second dielectric layer 900 can be formed using a variety of suitable methods, such as flowable chemical vapor disposition (CVD) or spin-on-dielectric processes.

Figure 10:
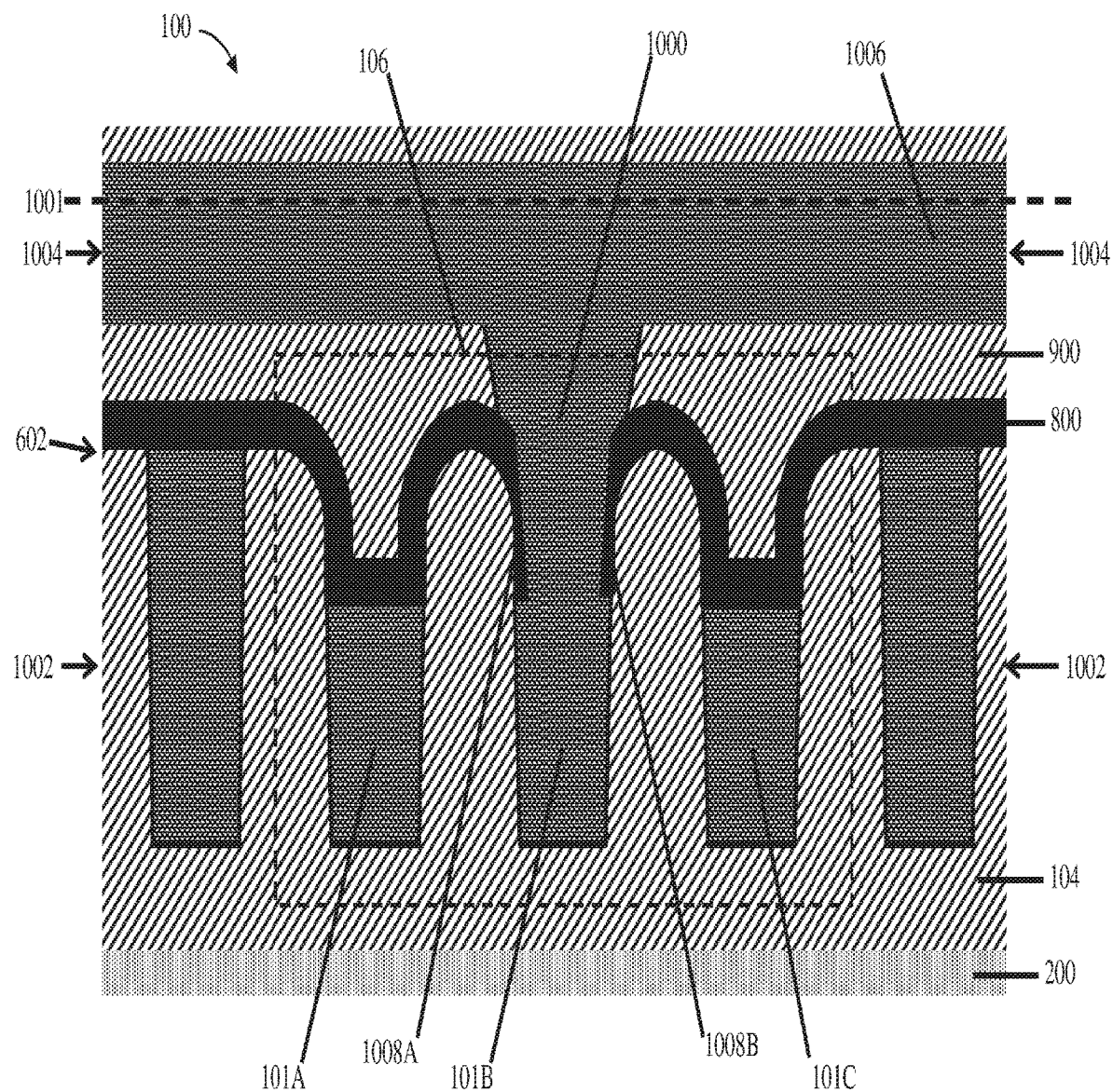
FIG. 10 depicts a cross-sectional view along line A-A after forming a vertical metal line interconnect (via) fully aligned in a first direction of a first interconnect layer and a second direction of a second interconnect layer within the selective recess region.

FIG. 10 is a cross-sectional view of the structure 100 having a metal line interconnect (via) 1000 fully aligned to both a first direction 110 (shown in FIG. 1) and a second direction 1001 in the selective recess region 106. Metal lines 102A, 102B, 102C are deposited in a first dielectric layer 104. The metal lines are parallel to each other in the first direction 110 and define a first interconnect level 1002. The portions 101A, 101B, and 101C of the three metal lines 102A, 102B, and 102C within the selective recess region 106 are recessed below a top surface 602 of the first dielectric layer 104.

A trench 1006, which defines a second interconnect level 1004, and the via 1000 can be formed using a typical BEOL single or dual damascene metallization operation ($V_x/M_{x+1}$ process). Any suitable self-aligned vertical interconnect access (SAV) scheme for forming a self-aligned via (SAV) damascene structure can be used to form a via self-aligned in the direction perpendicular to the second direction 1001 (i.e., the direction along the trench 1006). In some embodiments, the first interconnect level 1002 is orthogonal to the second interconnect level 1004, such that the direction perpendicular to the second direction 1001 is the first direction 110. In one or more embodiments, a pattern trench first scheme is used wherein at least one trench 1006 is formed along the second direction 1001 on the second dielectric layer 900 prior to the via 1000 metallization operation, such that the trench 1006 allows the via 1000 to self-align perpendicularly to the second direction 1001.

The cap 800 on the first dielectric layer 104 ensures that the via 1000 will self-align perpendicularly to the first direction 110 (i.e., to align in the second direction 1001). During the via 1000 metallization operation, a via RIE removes a portion of the cap 800 to expose the portion 101B of metal line 102B. In some embodiments, the via RIE partially erodes sidewalls 1008A and 1008B of the cap 800. Self-containment, however, leading to a reduced via 1000 size, is maintained even if the sidewalls 1008A and 1008B are partially eroded. For example, if the via 1000 contacts the cap 800 while being deposited into the via landing site 108 the via 1000 will not pass through the cap 800 but will instead conform to the shape of the cap 800. As such, the cap 800 serves as a barrier between the via 1000 and the neighboring metal lines that forces the via to self-align in the second direction 1001, preventing a short from forming during the metallization operation. In this manner, the incoming via aspect ratio is reduced at the expense of reducing the metal height in and around the via landing site 108, resulting in an improved metal fill and a reduction in the risk of a ULK line flop over.

Figure 11:
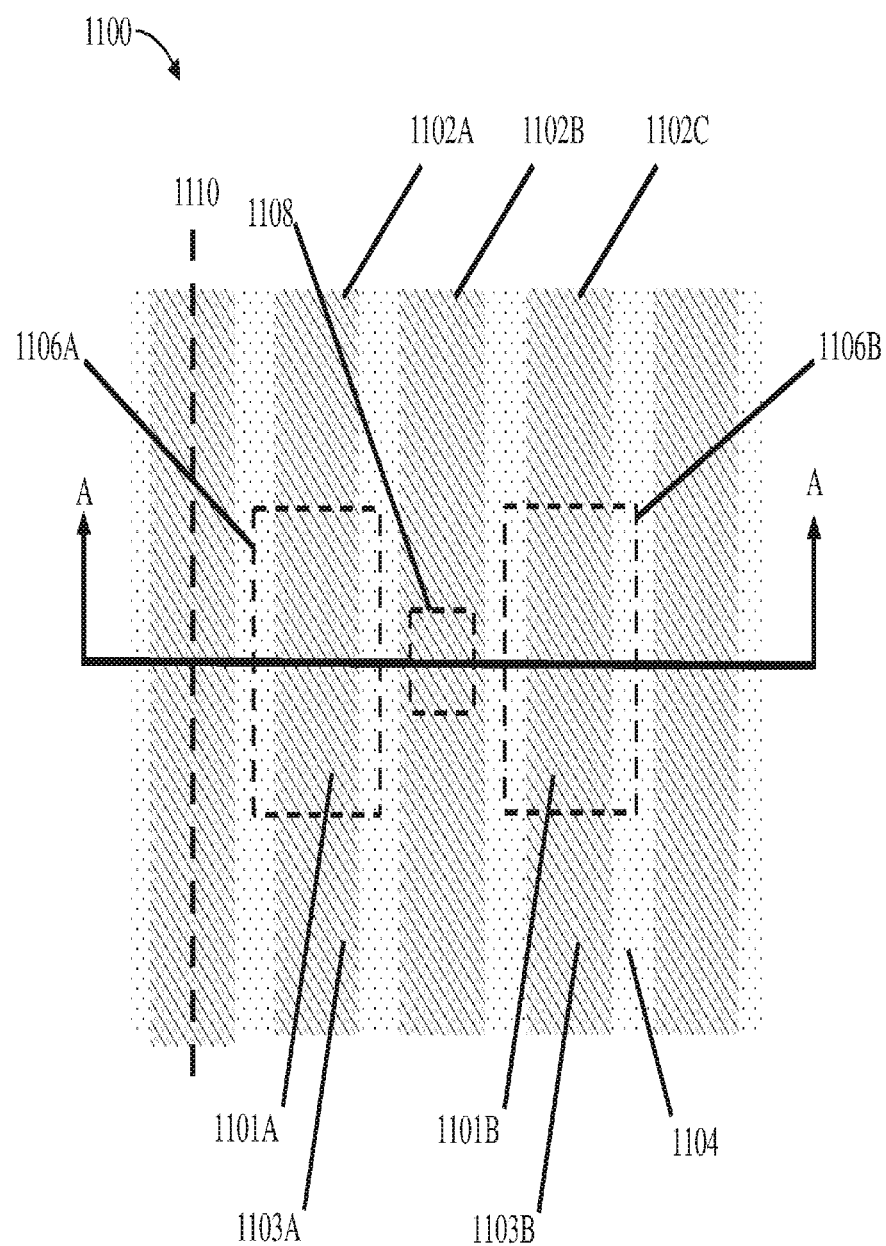
FIG. 11 depicts a top-down view of another structure after an intermediate operation of a method of fabricating a semiconductor device having a fully aligned via according to one or more embodiments of the present invention.

FIG. 11 illustrates a top-down view of another structure 1100 having a plurality of metal lines formed in a first dielectric layer 1104 during an intermediate operation of a method of fabricating a semiconductor device that will have a fully aligned via 1500 (shown in FIG. 15) formed in a via landing site 1108 according to one or more embodiments. Selective recess regions 1106A and 1106B overlap a portion (e.g., 1101A and 1101B) of metal lines 1102A and 1102C of the plurality of metal lines. The remaining metal lines of the plurality of metal lines lie outside the selective recess regions 1106A and 1106B. Via landing site 1108 delineates a region between the selective recess regions 1106A and 1106B where the via 1500 will be deposited during a damascene metallization operation, which will be described in greater detail later in this detailed description. The metal lines 1102A, 1102B, and 1102C are parallel to each other in a first direction 1110. For ease of illustration and description, only some of the plurality of metal lines are depicted (e.g., metal lines 1102A, 1102B, 1102C, and two additional lines on either side thereof). However, it is understood that three or more metal lines can be utilized. Each of the metal lines 1102A and 1102C includes a first portion 1101A and 1101B that is within the selective recess regions 1106A and 1106B, respectfully, as well as a second portion 1103A and 1103B of the metals lines 1102A and 1102C that is outside the selective recess regions 1106A and 1106B.

Figure 12:
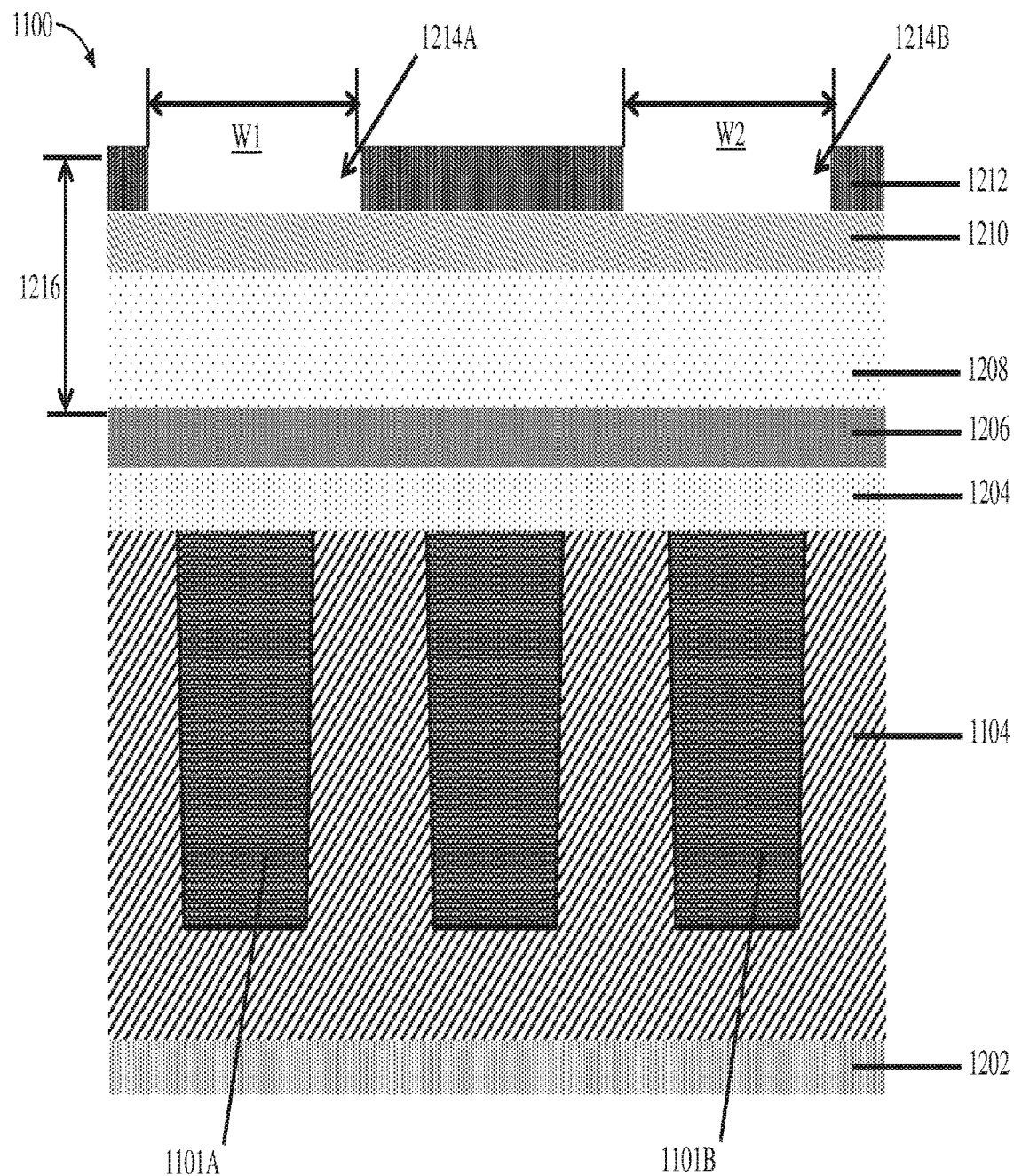
FIG. 12 depicts a cross-sectional view of the structure along line A-A of FIG. 11 according to one or more embodiments of the present invention.

FIG. 12 illustrates a cross-sectional view of the structure 1100 along the line A-A of FIG. 11 during an intermediate operation of a method of fabricating a semiconductor device having a fully aligned via. The first dielectric layer 1104 can be formed on a substrate 1202. This view illustrates the portions 1101A and 1101B of the metal lines 1102A and 1102C that are within the selective recess regions 1106A and 1106B.

The structure 1100 includes a substrate 1202 below the first dielectric layer 1104 and a sacrificial nitride layer 1204, a low temperature oxide layer 1206, and a tri-layer mask 1216 including a photoresist layer 1212, an anti-reflected coating layer 1210 and an organic underlayer 1208 formed on the first dielectric layer 1104, in a like configuration and formed in a like manner as in the structure 100 depicted in FIG. 4. In this embodiment, however, the photoresist layer 1212 is selectively patterned with two openings 1214A and 1214B having widths W1 and W2, respectfully, such that the photoresist is not on top of the portions 1101A and 1101B of the metal lines 1102A and 1102C (i.e., within the selective recess regions 1106A and 1106B as depicted in FIG. 11).

Figure 13:
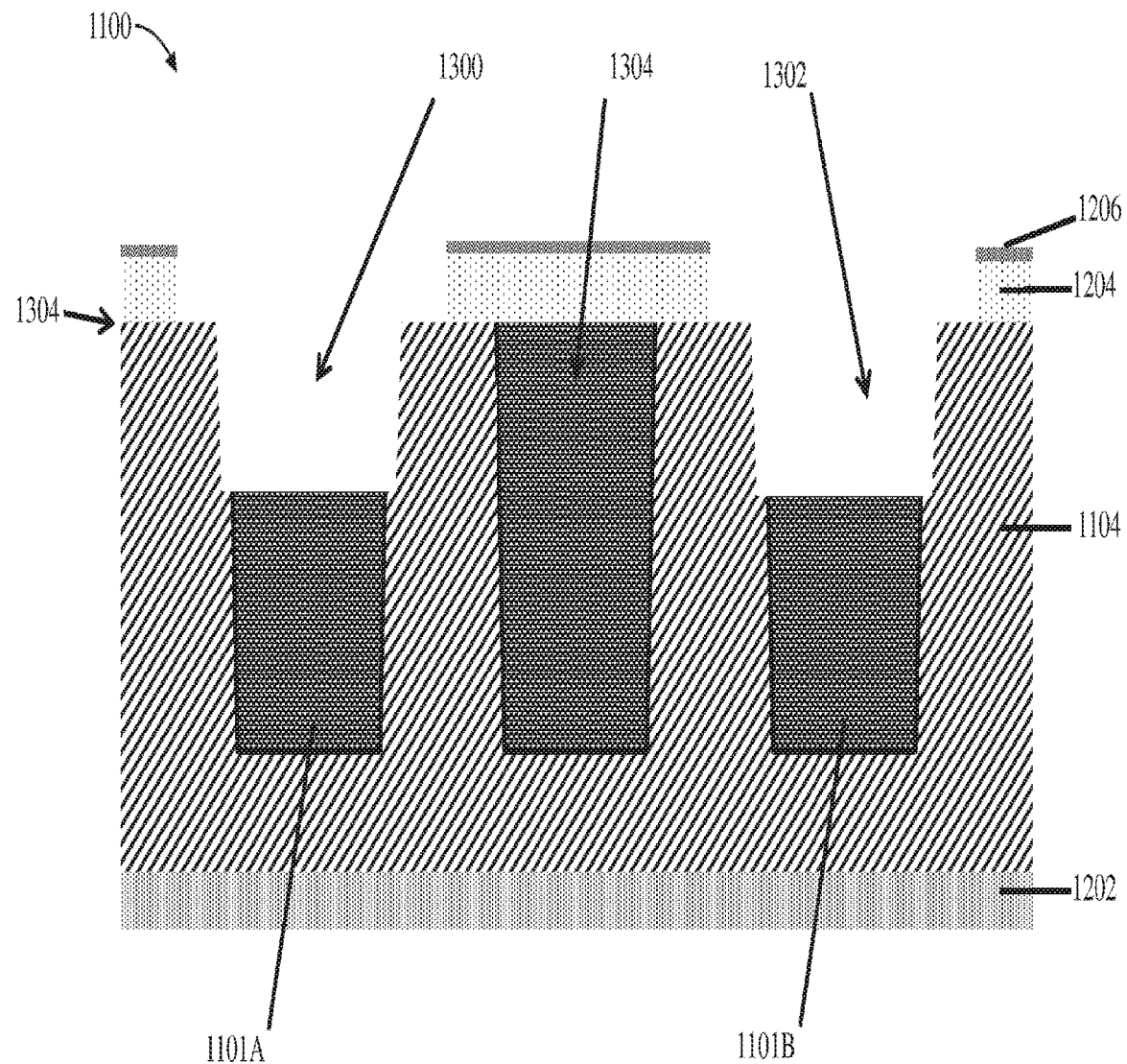
FIG. 13 depicts the cross-sectional view along line A-A of FIG. 11 after opening a tri-layer mask pattern and removing a sacrificial nitride layer and a low temperature oxide layer according to one or more embodiments of the present invention.

FIG. 13 is a cross-sectional view of the structure 1100 after opening the tri-layer mask pattern 1216 (as depicted in FIG. 12) and removing the sacrificial nitride layer 1204 and the low temperature oxide layer 1206 on top of the portions 1101A and 1101B of the metal lines 1102A and 1102C (i.e., within the selective recess regions 1106A and 1106B as depicted in FIG. 11) in a like manner as in the structure 100 depicted in FIG. 5. In one embodiment, strong oxygen plasma is used to strip the lithographic stacks including the sacrificial nitride layer 300 and the low temperature oxide layer 302. The portions 1101A and 1101B of the metal lines 1102A and 1102C are adjacent to, and on opposite sides of, a metal line 1304 which is not recessed. Recessed openings 1300 and 1302 are formed by recessing portions 1101A and 1101B of the metal lines 1102A and 1102C (as depicted in FIG. 11) within the selective recess regions 1106A and 1106B below a top surface 1304 of the first dielectric layer 1104. The recessed openings 1300 and 1302 can be formed using any etching technique, such as, for example, reactive ion etching (RIE) and/or wet etching. In one embodiment, the recessing can be performed in a manner where the bulk of the metal lines can be removed in a separate operation from a metal barrier liner.

Figure 14:
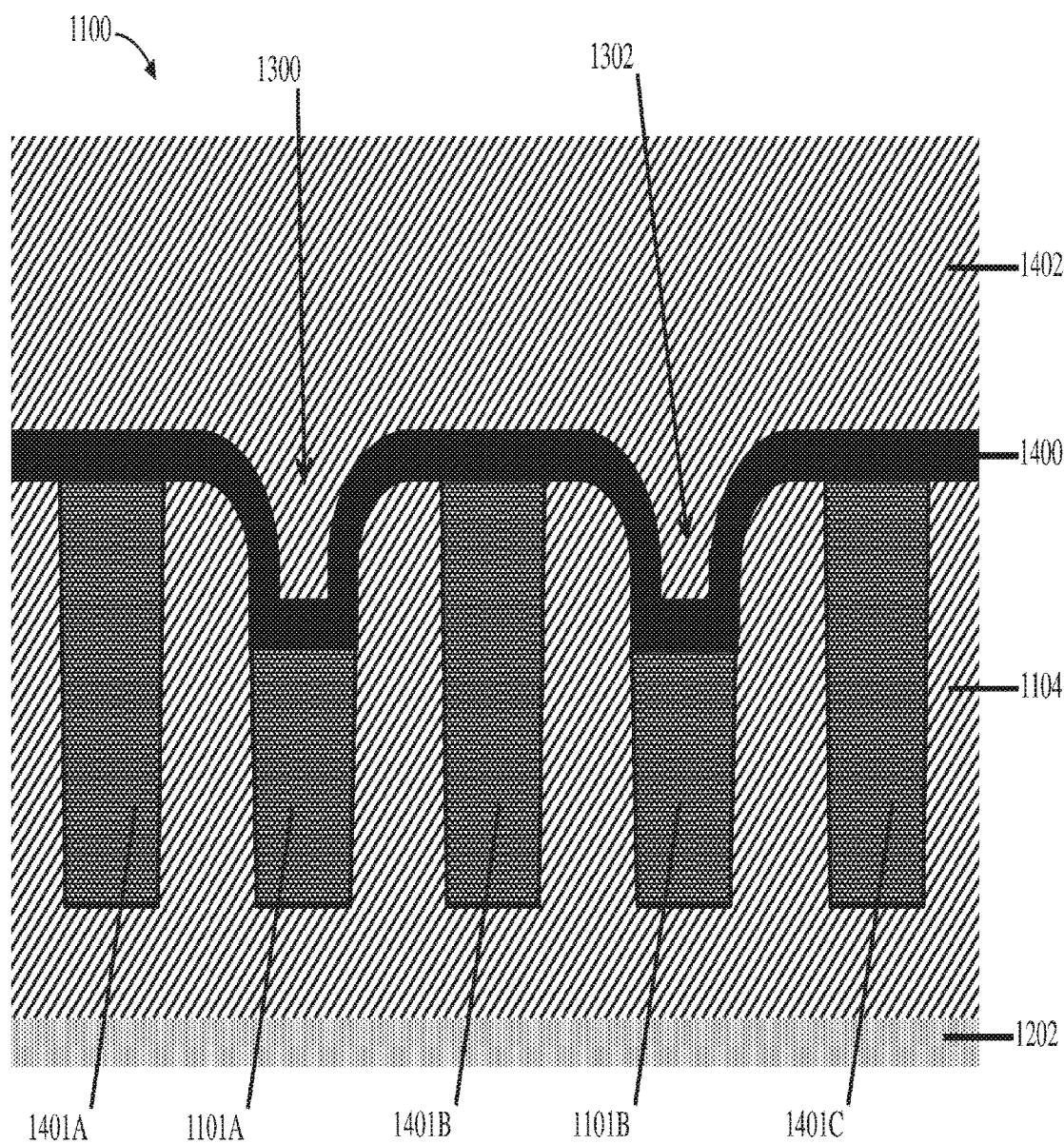
FIG. 14 depicts a cross-sectional view along line A-A of FIG. 11 after stripping the remaining low temperature oxide layer and the sacrificial nitride layer hard mask according to one or more embodiments of the present invention.

FIG. 14 is an expanded cross-sectional view along the line A-A of FIG. 11 which includes metal lines 1401A, 1401B and 1401C which are located outside of the selective recess regions 1106A and 1106B, as is depicted in FIG. 11, after stripping the remaining low temperature oxide layer 1206 and sacrificial nitride layer 1204 hard mask in a like manner as in the structure 100 depicted in FIG. 7. A cap 1400 is formed on the first dielectric layer 1104 and in the first recess 1300 and in the second recess 1302, in a like manner as in the structure 100 depicted in FIG. 8. The cap can be conformally formed using any suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. In some embodiments the cap is a silicon nitride, silicon carbonitride (SiNCH), or metal nitride.

A second dielectric layer 1402 is formed on the cap 1400, in a like manner as is depicted in FIG. 9. In some embodiments, the first dielectric layer 1104 and the second dielectric layer 1402 are the same dielectric material. The second dielectric layer 1402 can be formed using any suitable method, such as flowable chemical vapor disposition (CVD) or spin-on-dielectric processes.

Figure 15:
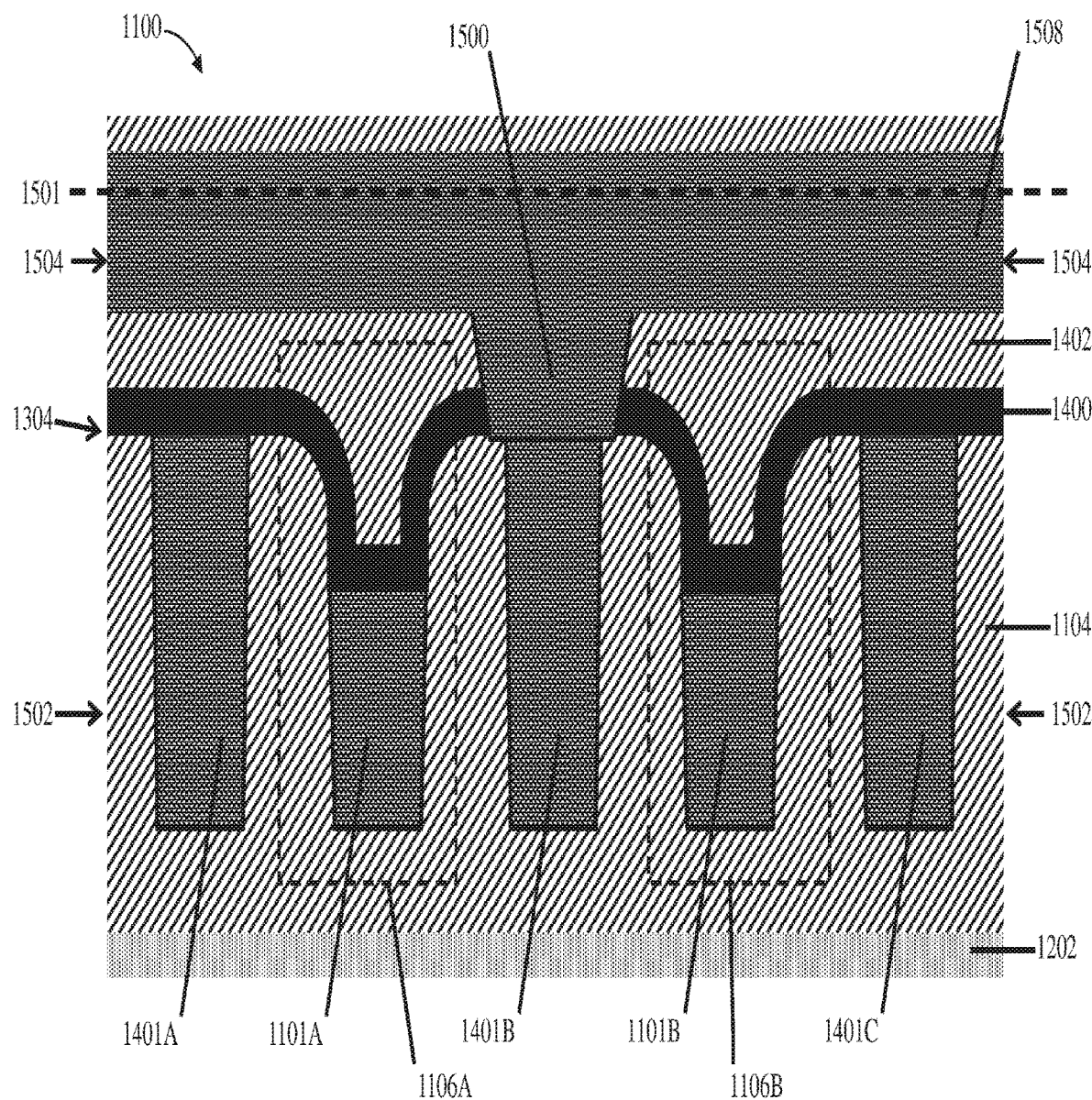
FIG. 15 depicts a cross-sectional view along line A-A of FIG. 11 after forming a vertical metal line interconnect (via) fully aligned in a first direction of a first interconnect layer and a second direction of a second interconnect layer within the selective recess regions according to one or more embodiments of the present invention.

FIG. 15 is a cross-sectional view of the structure 1100 having a metal line interconnect (via) 1500 fully aligned to both a first direction 1110 (shown in FIG. 11) and a second direction 1501 in the selective recess regions 1106A and 1106B. Metal lines 1102A, 1102B and 1102C are deposited in a first dielectric layer 1104. The metal lines are parallel to each other in the first direction 1110 and define a first interconnect level 1502. The portions 1101A and 1101B of the metal lines 1102A and 1102B within the selective recess regions 1106A and 1106B, respectfully, are recessed below the top surface 1304 of the first dielectric layer 1104.

A trench 1508, which defines a second interconnect level 1504, and the via 1500 can be formed using a typical BEOL single or dual damascene metallization operation ($V_x/M_{x+1}$ process). Any suitable self-aligned vertical interconnect access (SAV) scheme for forming a self-aligned via (SAV) damascene structure can be used to form a via self-aligned in the direction perpendicular to the second direction 1501 (i.e., the direction along the trench 1508). In some embodiments, the first interconnect level 1502 is orthogonal to the second interconnect level 1504, such that the direction perpendicular to the second direction 1501 is the first direction 1110. In one or more embodiments, a pattern trench first scheme is used wherein at least one trench 1508 is formed along the second direction 1501 on the second dielectric layer 1402 prior to the via 1500 metallization operation, such that the trench 1508 allows the via 1500 to self-align perpendicularly to the second direction 1501.

The cap 1400 on the first dielectric layer 1104 guides the via 1500 to self-align perpendicularly to the first direction 1110 (i.e., the second direction 1501). For example, if the via 1500 contacts the cap 1400 while being deposited into the via landing site 1108 (shown in FIG. 11) the via 1500 will conform to the shape of the cap 1400 and will not pass through. As such, the cap 1400 serves as a barrier between the via 1500 and the neighboring metal lines which forces the via to self-align in the second direction 1501, preventing a short from forming during the metallization process.

In this embodiment, only the neighboring metal lines 1101A and 1101B, adjacent to the via landing site 1108, are recessed. As a result, a full via approach aspect ratio is maintained at the via landing site 1108 without a corresponding spacing reduction between the first interconnect level and the second interconnect level. A full via approach aspect ratio relaxes the cap/ULK selectivity requirement to achieve a desired capacitance because the via is landing on a taller site, which results in a higher capacitance. This method requires a more precise lithography than that required by the process employed to form the structure 100 as depicted in FIG. 10 and as described herein. In some embodiments this method (i.e., wherein only the neighboring metal lines are recessed) is reserved for portions of the overall lithography having a critical capacitance requirement.

Figure 16:
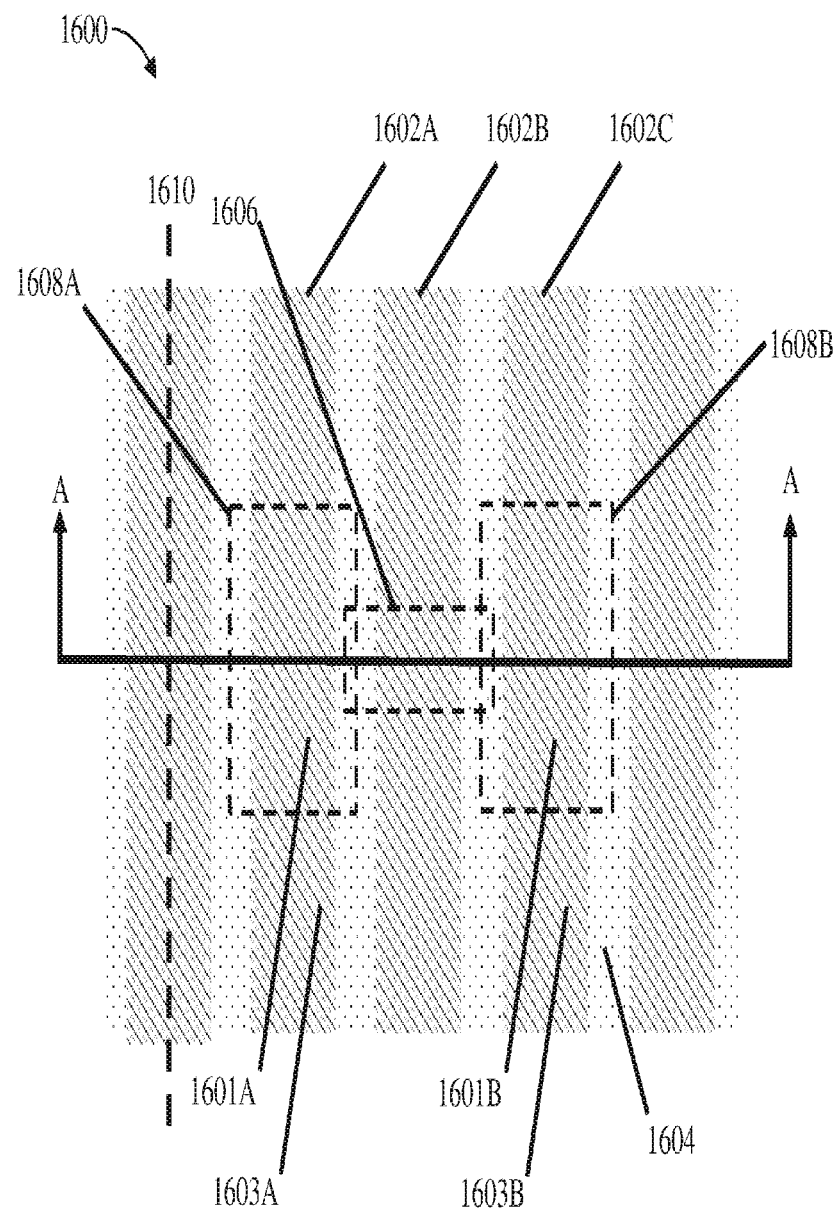
FIG. 16 depicts a top-down view of another structure after an intermediate operation of a method of fabricating a semiconductor device having a fully aligned via according to one or more embodiments of the present invention.

FIG. 16 illustrates a top-down view of another structure 1600 having metal lines 1602A, 1602B, and 1602C parallel to each other in a first direction 1610, in a first dielectric layer 1604 during an intermediate operation of a method of fabricating a semiconductor device having a fully aligned via 1900 (shown in FIG. 19) according to one or more embodiments. A via landing site 1606, between selective recess regions 1608A and 1608B, delineates a region wherein the via 1900 will be deposited during a damascene metallization operation. Selective recess regions 1608A and 1608B overlap a portion (e.g., 1601A and 1601B) of metal lines 1602A and 1602C of the plurality of metal lines. The remaining metal lines of the plurality of metal lines lie outside the selective recess regions 1608A and 1608B. Via landing site 1606 delineates a region between the selective recess regions 1608A and 1608B where the via 1900 will be deposited during a damascene metallization operation, which will be described in greater detail later in this detailed description. The metal lines 1602A, 1602B, and 1602C are parallel to each other in a first direction 1610. For ease of illustration and description, only some of the plurality of metal lines are depicted (e.g., metal lines 1602A, 1602B, 1602C, and two additional lines on either side thereof). However, it is understood that three or more metal lines can be utilized. Each of the metal lines 1602A and 1602C includes a first portion 1601A and 1601B that is within the selective recess regions 1608A and 1608B, respectfully, as well as a second portion 1603A and 1603B that is outside the selective recess regions 1106A and 1106B.

Figure 17:
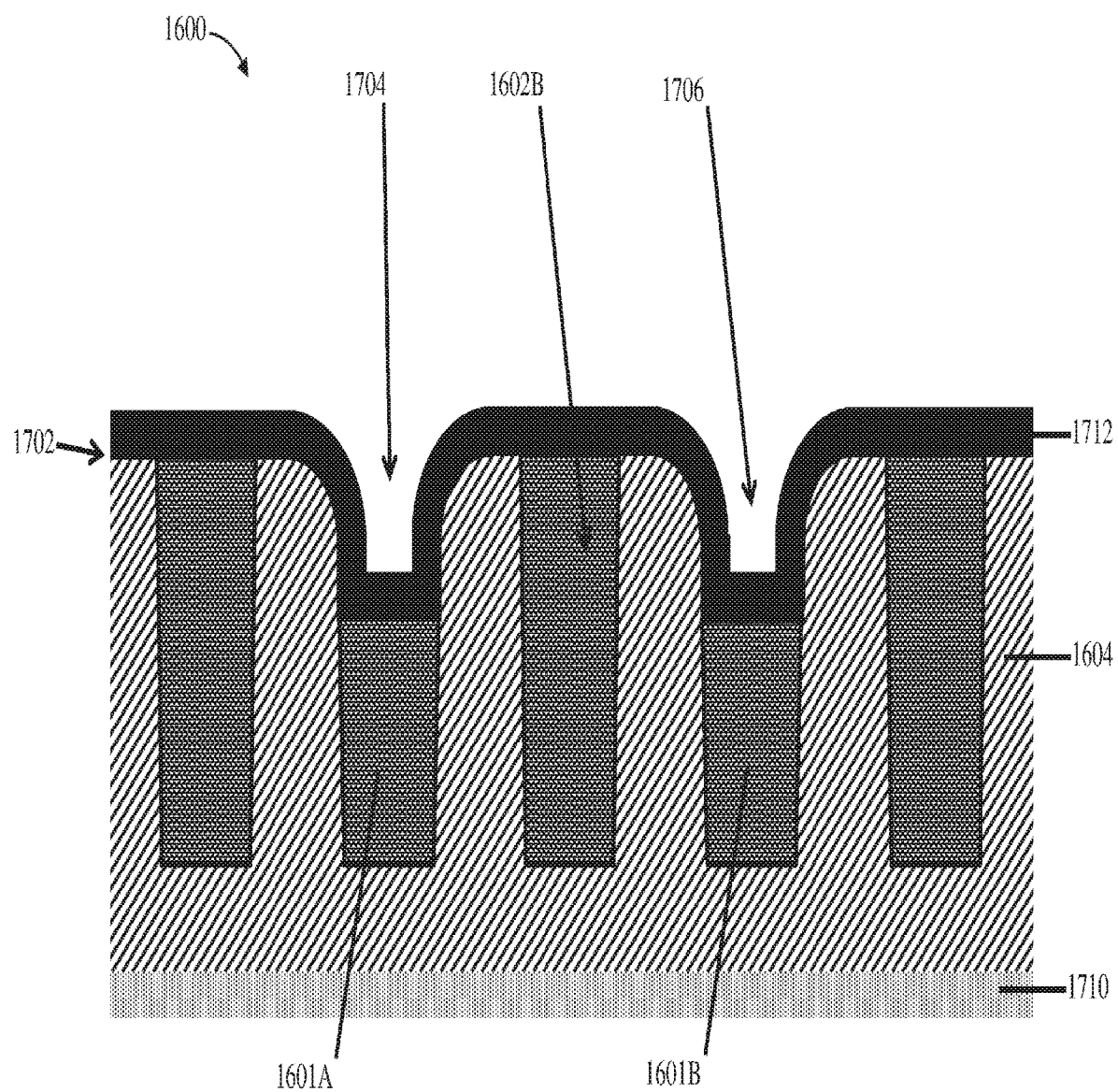
FIG. 17 depicts a cross-sectional view along the line A-A of FIG. 16 according to one or more embodiments of the present invention.

FIG. 17 is a cross-sectional view along the line A-A of FIG. 16. The structure 1600 includes recessed portions 1601A and 1601B of metal lines 1602A and 1602C (shown in FIG. 16) recessed below a top surface 1702 of the first dielectric layer 1604. The region above each of the recessed lines 1601A and 1601B defines a first recess 1704 and a second recess 1706, respectively. The metal lines 1602A and 1602C are adjacent to, and on opposite sides of, a metal line 1602B which is not recessed. The recessed portions 1601A and 1601B of metal lines 1602A and 1602C and the associated first recess 1704 and second recess 1706 can be formed using any etching technique, such as, for example, reactive ion etching (RIE) and/or wet etching.

The first dielectric layer 1604 is formed on a substrate 1710. A cap 1712 is formed on the first dielectric layer 1604 and in the first recess 1704 and in the second recess 1706, in a like manner as in the structure 100 depicted in FIG. 8. The cap can be conformally formed using any suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. In some embodiments the cap is a silicon nitride, silicon carbonitride (SiNCH), or metal nitride.

Figure 18:
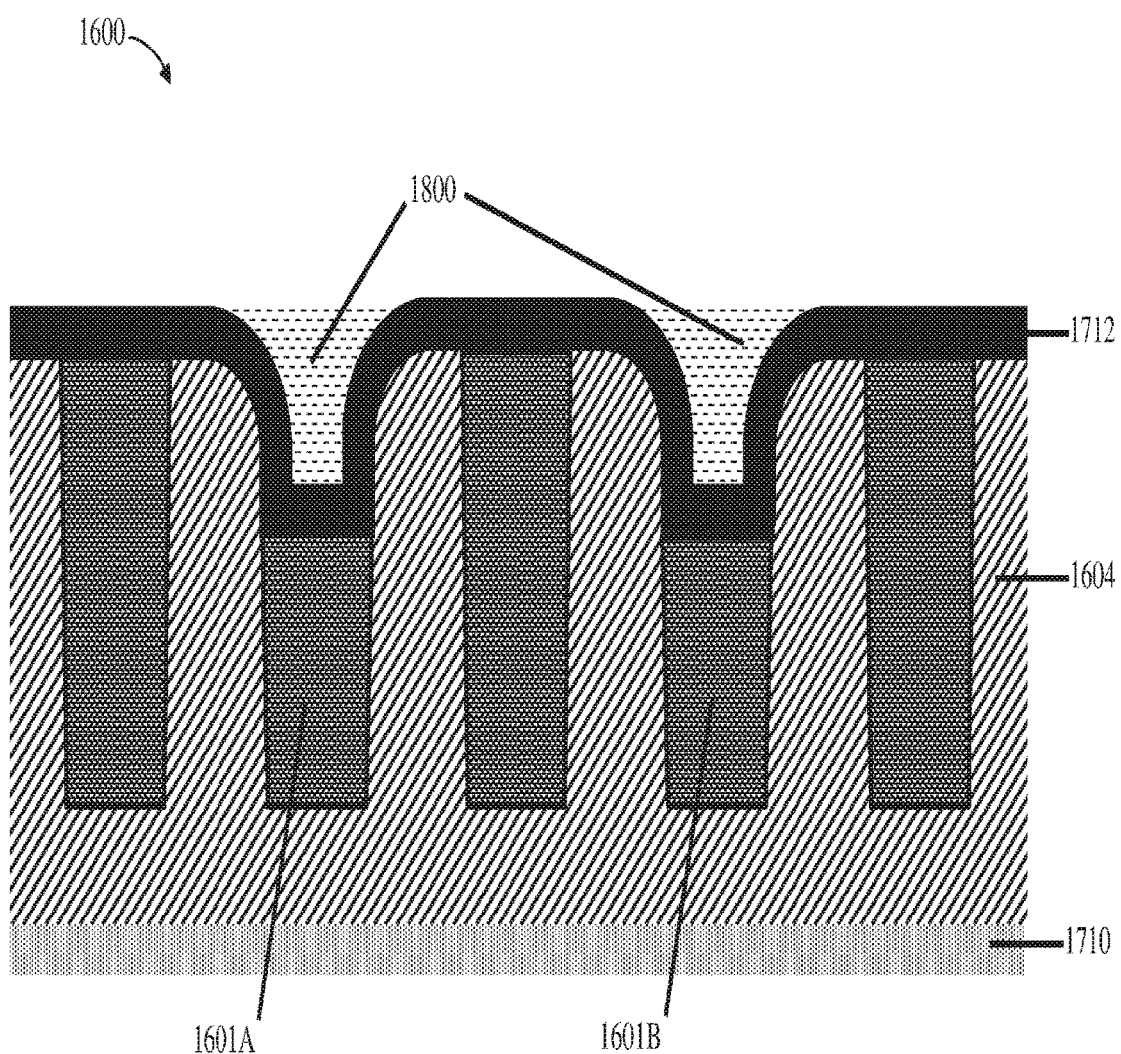
FIG. 18 depicts a cross-sectional view along line A-A of FIG. 16 after depositing an etch-resistant dielectric into a first recess and a second recess until the recesses are completely filled.

FIG. 18 is a cross-sectional view of the structure 1600 after depositing an etch-resistant dielectric 1800 into the first recess 1704 and the second recess 1706 until the recesses are completely filled. The etch-resistant dielectric 1800 forms a barrier between the two recessed portions 1601A and 1601B of metal lines 1602A and 1602C and the via 1900 (shown in FIG. 19) deposited in a later metallization process. The etch-resistant dielectric 1800 can be any dielectric with a high etch-resistance such as, but not limited to, a nitride or silicon nitride. The etch-resistant dielectric 1800 can also be a high-k dielectric having a dielectric constant greater than 4.0, 7.0, or 10.0. High-k dielectric materials include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The etch-resistant dielectric 1800 can be formed by any suitable deposition process, for example, chemical vapor deposition (CVD), plasma-enhanced chemical vapor deposition (PECVD), atomic layer deposition (ALD), evaporation, physical vapor deposition (PVD), chemical solution deposition, or other like processes.

Figure 19:
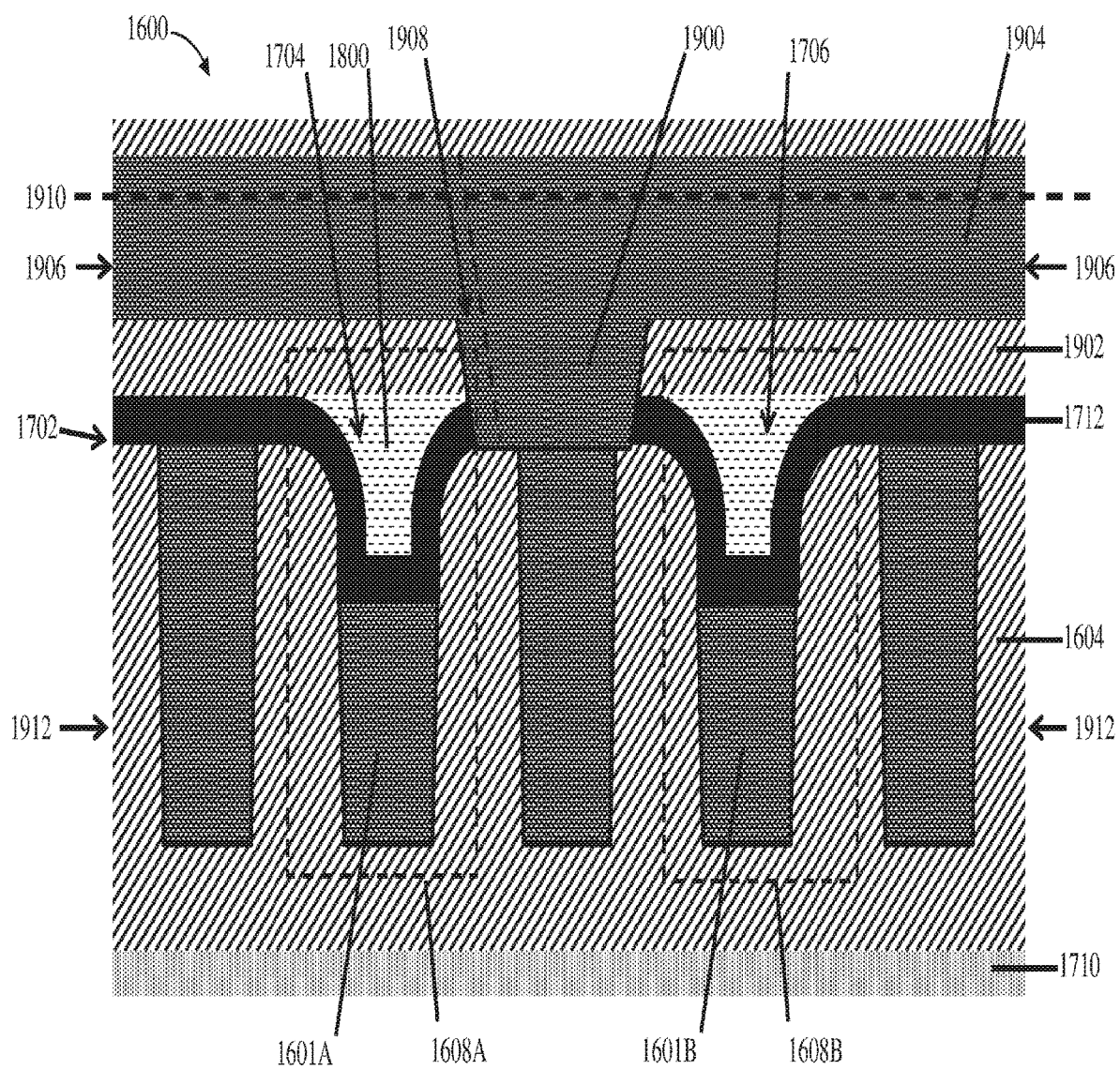
FIG. 19 depicts a cross-sectional view along line A-A of FIG. 16 after forming a vertical metal line interconnect (via) fully aligned in a first direction of a first interconnect layer and a second direction of a second interconnect layer within the selective recess regions according to one or more embodiments of the present invention.

FIG. 19 is a cross-sectional view of the structure 1600 having a metal line interconnect (via) 1900 fully aligned to both a first direction 1610 and a second direction 1910 in the selective recess regions 1608A and 1608B. The structure 1600 is substantially similar to the structure 1100 depicted in FIG. 15 and is formed in a like manner, except that the structure 1600 includes the etch-resistant dielectric 1800 which completely fills both the first recess 1704 and the second recess 1706. A second dielectric layer 1902 is formed on the cap 1712, in a like manner as is depicted in FIG. 9. In some embodiments, the second dielectric layer 1902 has a lower etch resistance than the etch-resistant dielectric 1800. In still other embodiments the second dielectric layer 1902 has a lower dielectric constant than the first dielectric layer 1604. Moreover, as these embodiments advantageously fill both the first recess 1704 and the second recess 1706 with the etch-resistant dielectric 1800, the likelihood of a non-ideal dielectric fill causing a void in either recess is reduced.

A trench 1904, which defines a second interconnect level 1906, and the via 1900 can be formed using a typical BEOL single or dual damascene metallization operation ($V_x/M_{x+1}$ process). Any suitable self-aligned vertical interconnect access (SAV) scheme for forming a self-aligned via (SAV) damascene structure can be used to form a via self-aligned in the direction perpendicular to the second direction 1910 (i.e., the direction along the trench 1904). In some embodiments, a first interconnect level 1912 is orthogonal to the second interconnect level 1906, such that the direction perpendicular to the second direction 1910 is the first direction 1610 (shown in FIG. 16). In one or more embodiments, a pattern trench first scheme is used wherein at least one trench 1904 is formed along the second direction 1910 on the second dielectric layer 1902 prior to the via 1900 metallization operation, such that the trench 1904 allows the via 1900 to self-align perpendicularly to the second direction 1910.

The cap 1712 on the first dielectric layer 1604 and the etch-resistant dielectric 1800 guide the via 1900 to self-align perpendicularly to the first direction 1610. The via 1900 cannot pass through either the cap 1712 or the etch-resistant dielectric 1800 while being deposited into the via landing site 1606 (shown in FIG. 16). As such, the cap 1712 and the etch-resistant dielectric 1800 serve as a barrier between the via 1900 and the neighboring metal lines which forces the via to self-align in the second direction 1910, preventing a short from forming during the metallization process.

In some embodiments, the combination of the cap 1712 and the etch-resistant dielectric 1800 allows for a via upsize or for a via which at least partially overlays the etch-resistant dielectric 1800 without causing a short during the metallization process. Vias tend to naturally shift from 1 to 10 nm, with a shift of 5 nm fairly common during the metallization process. The via overlay 1908, whether due to a via upsize or to a natural shift in the via position, can be prevented from shorting the first interconnect level 1912 by the etch-resistant dielectric 1800.

Figure 20:
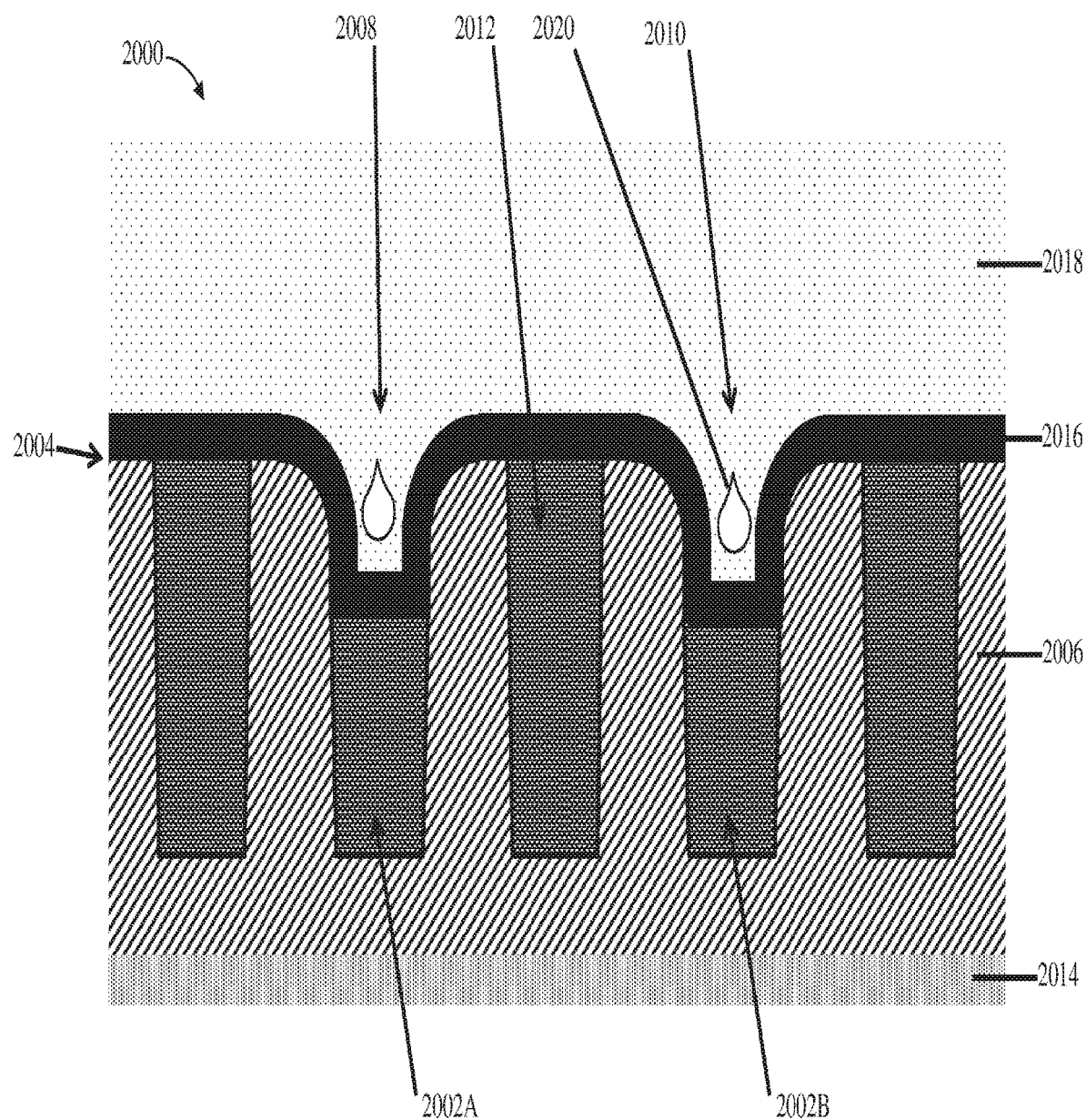
FIG. 20 depicts a cross-sectional view of another structure, wherein a porous silicon carbonitride ((p)SiNCH) 2018 is formed on the cap according to one or more embodiments of the present invention.

FIG. 20 illustrates yet another embodiment of the present invention. The structure 2000 of this embodiment is formed in a like manner as the structure 1600 as depicted in FIG. 17, except that in this embodiment a porous silicon carbonitride ((p)SiNCH) 2018 is formed on the cap 2016. Porous SiNCH advantageously serves as its own copper diffusion layer, obviating the need for any barrier metal liner, which saves space during the metallization operation.

The structure 2000 includes two recessed metal lines 2002A and 2002B recessed below a top surface 2004 of a first dielectric layer 2006. The region above each of the recessed lines 2002A and 2002B defines a first recess 2008 and a second recess 2010, respectively. The metal lines 2002A and 2002B are adjacent to, and on opposite sides of, a metal line 2012, which is not recessed. The first dielectric layer 2006 is formed on a substrate 2014. A cap 2016 is conformally formed on the first dielectric layer 2006 and in the first recess 2008 and in the second recess 2010, in a like manner as in the structure 100 depicted in FIG. 8. The cap can be conformally formed using any suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. In some embodiments the cap is a silicon nitride, silicon carbonitride (SiNCH), or metal nitride.

In some embodiments the cap 2016 prevents a via (not depicted) deposited during the following metallization operation from passing through a void 2020 within either the first recess 2008 or the second recess 2010. PECVD low-k films with poor gap filling capabilities, such as, for example, porous SiNCH, are often avoided in gap-filling applications. As this embodiment advantageously confines the porous SiNCH to recessed regions where the via will not land, porous SiNCH can be used in place of some other dielectric having good gap-filling properties, but which requires a barrier metal liner. In some embodiments, the porous SiNCH can be replaced with other low-k films having poor gap filling capabilities.

Figure 21:
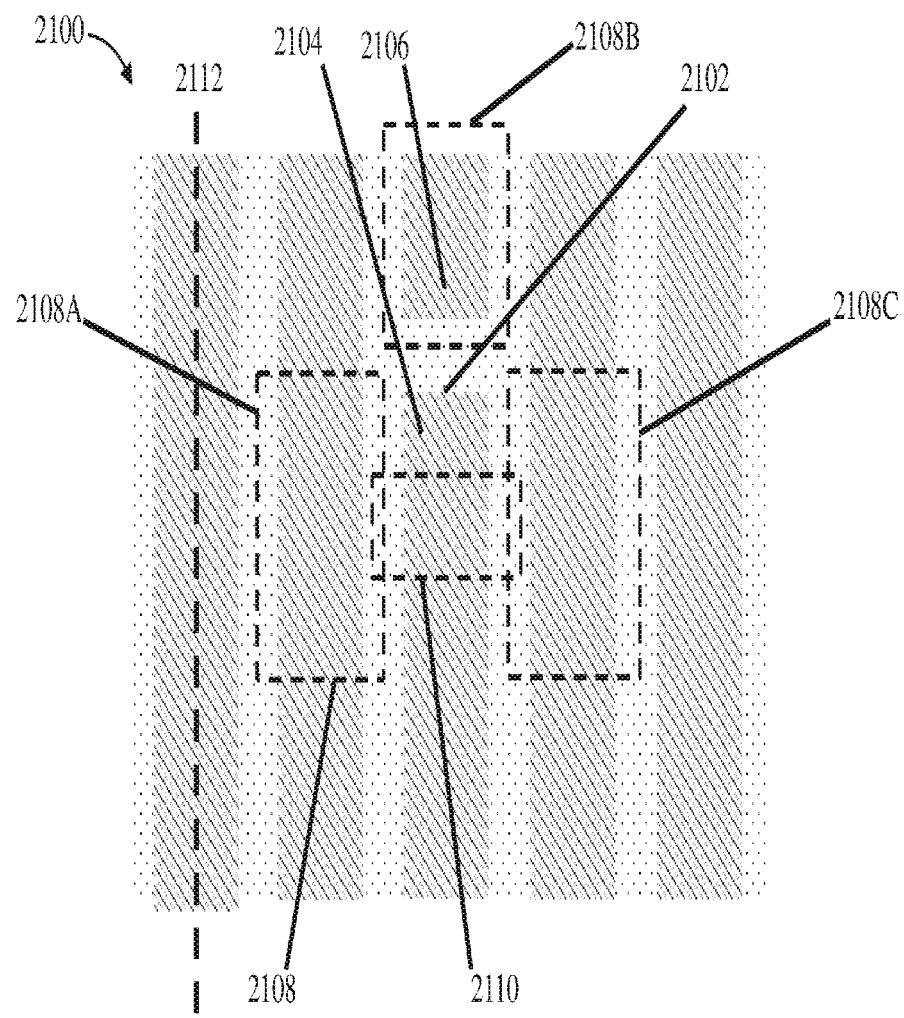
FIG. 21 depicts a top-down view of another structure, wherein a line end separates a first metal line and a second metal line along a first direction according to one or more embodiments of the present invention.

FIG. 21 illustrates yet another embodiment of the present invention. The structure 2100 of this embodiment is substantially similar to, and formed in a like manner as, the structure 1600 as depicted in FIG. 16, except that in this embodiment a line end 2102 exists which separates a first metal line 2104 and a second metal line 2106 along a first direction 2112. Line end adjacent shapes can be complicated, requiring asymmetric lines or space reduced process windows. In this embodiment a plurality of line selective recess windows 2108A, 2108B, and 2108C define areas for selectively recessing metal lines to control a via (not depicted) deposited in a via landing site 2110 during a metallization operation from causing a short in accordance with any previous embodiment taught by this invention.

Figure 22:
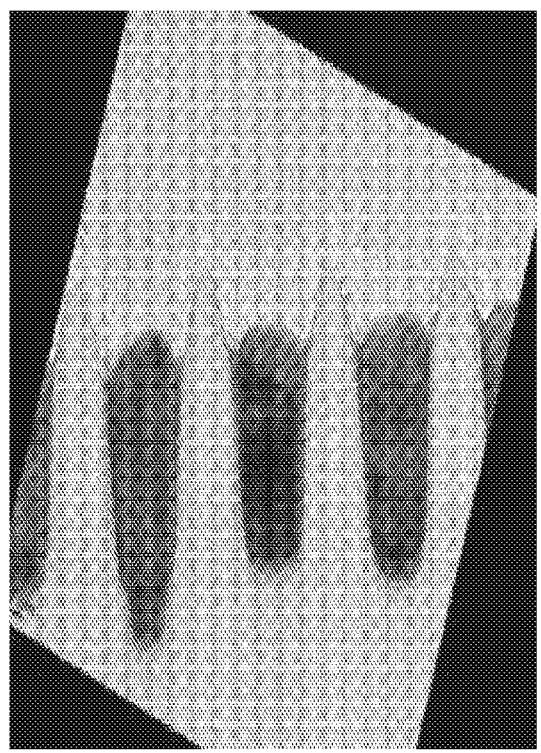
FIG. 22 depicts a selective copper-liner wet recess (TaN/Co/Cu) according to one or more embodiments of the present invention.

FIG. 22 illustrates a selective copper-liner wet recess (TaN/Co/Cu) in accordance with one or more embodiments of the present invention. The structure 2200 demonstrates a wet recess process having a good selectivity to ULK.

Figure 23:
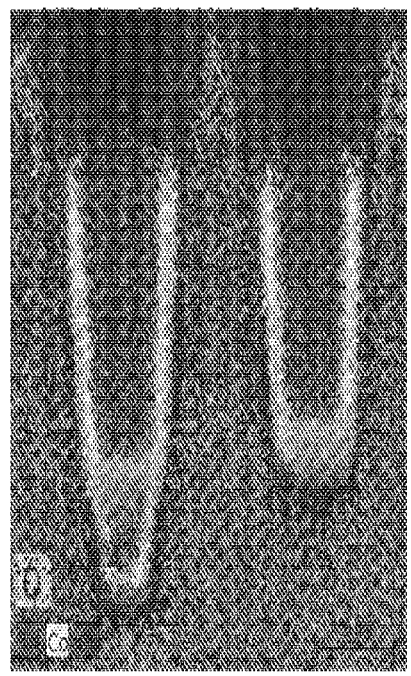
FIG. 23 depicts a selective copper-liner wet recess elemental map (TaN/Co/Cu) of a portion of FIG. 22 according to one or more embodiments of the present invention.

FIG. 23 illustrates a selective copper-liner wet recess elemental map (TaN/Co/Cu) of a portion of FIG. 22 in accordance with one or more embodiments of the present invention. The structure 2300 demonstrates a wet recess process having a good selectivity to ULK.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. An interconnect structure for a semiconductor device, the interconnect structure comprising:
   a first dielectric layer;
   a first metal line, a second metal line, and a third metal line, the first metal line, the second metal line, and the third metal line extending parallel to each other in a first direction and formed in a first metallization layer, wherein the second metal line is disposed adjacent to and between the first metal line and the third metal line;
   a first region comprising (i) a first segment of the first metal line and (ii) a first segment of the second metal line, wherein the first segment of the first metal line and the first segment of the second metal line are recessed relative to a top surface of the first dielectric layer; and
   a second region comprising a first segment of the third metal line, the first segment of the third metal line comprising a top surface at substantially the same level as the top surface of the first dielectric layer.

2. The interconnect structure of claim 1, further comprising a third region adjacent to the first and second regions, wherein:

the third region comprises a second segment of the first metal line, a second segment of the second metal line, and a second segment of the third metal line; and the second segment of the first metal line, the second segment of the second metal line, and the second segment of the third metal line each comprise a top surface at substantially the same level as the top surface of the first dielectric layer.

3. The interconnect structure of claim 1, further comprising an interlayer dielectric layer comprising a cap layer and a second dielectric layer, wherein:

the cap layer comprises one or more first materials and the second dielectric layer comprises one or more second materials, at least one of the one or more first materials being different from at least one of the one or more second materials; and the interlayer dielectric layer is disposed on (i) the first dielectric layer and (ii) the first metal line, the second metal line, and the third metal line.

4. The interconnect structure of claim 3, further comprising a via connecting to the first segment of the first metal line.

5. The interconnect structure of claim 4, wherein the via comprises an upper portion bounded by the second dielectric layer and a lower portion bounded (i) in part by the cap layer and (ii) in part by the second dielectric layer.

6. The interconnect structure of claim 5, wherein the lower portion of the via is self-aligned to the first segment of the first metal line.

7. The interconnect structure of claim 6, wherein the via connects to a fourth metal line extending in a second direction in a second metallization layer, the second direction being substantially orthogonal to the first direction.

8. The interconnect structure of claim 7, further comprising:

a fifth metal line extending parallel to the first, second, and third metal lines in the first direction and formed in the first metallization layer; and a sixth metal line, extending parallel to the first, second, and third metal lines in the first direction and formed in the first metallization layer, wherein the fifth metal line is adjacent to the first metal line on a side of the first metal line opposite from the second metal line, wherein the sixth metal line is adjacent to the fifth metal line on a side of the fifth metal line opposite from the first metal line, wherein the fifth metal line comprises a first segment in the first region and the first segment of the fifth metal line is recessed relative to the top surface of the first dielectric layer, wherein the sixth metal line comprises a first segment in a fourth region and the first segment of the sixth metal line comprises a top surface at substantially the same level as the top surface of the first dielectric layer, and wherein the fourth region is adjacent to the first region on a side of the first region opposite from the second region.

9. The interconnect structure of claim 6, wherein the via connects to a fourth metal line extending in a second direction in a second metallization layer, the second direction being substantially parallel to the first direction.

10. The interconnect structure of claim 9, further comprising:

a fifth metal line extending parallel to the first, second, and third metal lines in the first direction and formed in the first metallization layer; and a sixth metal line, extending parallel to the first, second, and third metal lines in the first direction and formed in the first metallization layer, wherein the fifth metal line is adjacent to the first metal line on a side of the first metal line opposite from the second metal line, wherein the sixth metal line is adjacent to the fifth metal line on a side of the fifth metal line opposite from the first metal line, wherein the fifth metal line comprises a first segment in the first region and the first segment of the fifth metal line is recessed relative to the top surface of the first dielectric layer, wherein the sixth metal line comprises a first segment in a fourth region and the first segment of the sixth metal line comprises a top surface at substantially the same level as the top surface of the first dielectric layer, and wherein the fourth region is adjacent to the first region on a side of the first region opposite from the second region.

11. The interconnect structure of claim 3, wherein the cap layer comprises silicon and nitrogen.

12. The interconnect structure of claim 3, wherein the cap layer comprises silicon, nitrogen, and carbon.

13. The interconnect structure of claim 3, wherein the cap layer comprises a metal oxide.

14. The interconnect structure of claim 3, wherein the interlayer dielectric layer only partially fills the recessed portion of the second metal line, a remaining portion of the recessed portion comprising a void.

15. An interconnect structure for a semiconductor device, the interconnect structure comprising:

a first dielectric layer;

a first metal line and a second metal line, the first metal line and the second metal line extending parallel to each other in a first direction and formed in a first metallization layer, the first metal line disposed adjacent to the second metal line;

a first region comprising (i) a first segment of the first metal line and (ii) a first segment of the second metal line, wherein the first segment of the first metal line comprises a top surface below a top surface of the first dielectric layer, and wherein the first segment of the second metal line comprises a top surface below the top surface of the first dielectric layer; and a second region adjacent to the first region, the second region comprising (i) a second segment of the first metal line and (ii) a second segment of the second metal line, wherein the second segment of the first metal line comprises a top surface at substantially the same level as the top surface of the first dielectric layer, and wherein the second segment of the second metal line comprises a top surface at substantially the same level as the top surface of the first dielectric layer.

16. The interconnect structure of claim 15, further comprising an interlayer dielectric layer comprising a cap layer and a second dielectric layer, wherein:

the cap layer comprises one or more of first materials and the second dielectric layer comprises one or more second materials, at least one of the one or more first materials being different from at least one of the one or more second materials; and the interlayer dielectric layer is disposed on (i) the first dielectric layer and (ii) the first metal line and the second metal line.

17. The interconnect structure of claim 16, further comprising a via connecting to the first segment of the first metal line.

18. The interconnect structure of claim 17, wherein the via comprises an upper portion bounded by the second dielectric layer, and a lower portion bounded (i) in part by the cap layer and (ii) in part by the second dielectric layer.

19. The interconnect structure of claim 18, wherein the lower portion of the via is self-aligned to the first segment of the first metal line.

20. The interconnect structure of claim 17, wherein the via connects to a third metal line extending in a second direction in a second metallization layer, the second direction being substantially orthogonal to the first direction.

21. The interconnect structure of claim 20, further comprising:
- a fourth metal line, a fifth metal line, and a sixth metal line, the fourth metal line, the fifth metal line, and the sixth metal line extending parallel to the first and second metal lines in the first direction and formed in the first metallization layer, wherein the fifth metal line is disposed in the first and second regions and is adjacent to the first metal line on a side of the first metal line opposite from the second metal line, wherein the fifth metal line comprises a first segment in the first region, wherein the first segment of the fifth metal line is recessed relative to the top surface of the first dielectric layer, wherein the fifth metal line comprises a second segment in the second region, and wherein the second segment of the fifth metal line is at substantially the same level as the top surface of the first dielectric layer;
- a third region adjacent to the first and second regions, comprising the fourth metal line, wherein the fourth metal line is adjacent to the second metal line on a side of the second metal line opposite from the first metal line and comprises a top surface at substantially the same level as the top surface of the first dielectric layer; and
- a fourth region adjacent to the first and second regions and comprising the sixth metal line, wherein the sixth metal line is adjacent to the fifth metal line on a side of the fifth metal line opposite from the first metal line and comprises a top surface at substantially the same level as the top surface of the first dielectric layer.

22. The interconnect structure of claim 17, wherein the via connects to a third metal line extending in a second direction in a second metallization layer, the second direction being substantially parallel to the first direction.

23. The interconnect structure of claim 22, further comprising:
- a fourth metal line, a fifth metal line, and a sixth metal line, the fourth metal line, the fifth metal line, and the sixth metal line extending parallel to the first and second metal lines in the first direction and formed in the first metallization layer, wherein the fifth metal line is disposed in the first and second regions and is adjacent to the first metal line on a side of the first metal line opposite from the second metal line, wherein the fifth metal line comprises a first segment in the first region, wherein the first segment of the fifth metal line is recessed relative to the top surface of the first dielectric layer, wherein the fifth metal line comprises a second segment in the second region, and wherein the second segment of the fifth metal line is at substantially the same level as the top surface of the first dielectric layer;
- a third region adjacent to the first and second regions, comprising the fourth metal line, wherein the fourth metal line is adjacent to the second metal line on a side of the second metal line opposite from the first metal line and comprises a top surface at substantially the same level as the top surface of the first dielectric layer; and
- a fourth region adjacent to the first and second regions and comprising the sixth metal line, wherein the sixth metal line is adjacent to the fifth metal line on a side of the fifth metal line opposite from the first metal line and comprises a top surface at substantially the same level as the top surface of the first dielectric layer.

24. The interconnect structure of claim 16, wherein the cap layer comprises silicon and nitrogen.

25. The interconnect structure of claim 16, wherein the cap layer comprises silicon, nitrogen, and carbon.

26. The interconnect structure of claim 16, wherein the cap layer comprises a metal oxide.

27. The interconnect structure of claim 16, wherein the interlayer dielectric layer only partially fills the recessed portion of the second metal line, a remaining portion of the recessed portion comprising a void.

* * * * *